United States Patent
Park et al.

(10) Patent No.: US 10,224,383 B2
(45) Date of Patent: Mar. 5, 2019

(54) ORGANIC LIGHT-EMITTING DISPLAY APPARATUS INCLUDING PIXEL DEFINING LAYER HAVING FIRST AND SECOND INCLINATION PORTIONS AND METHOD OF MANUFACTURING THE SAME

(71) Applicant: Samsung Display Co., Ltd., Yongin-si, Gyeonggi-do (KR)

(72) Inventors: Sangho Park, Yongin-si (KR); Joungkeun Park, Yongin-si (KR); Kwangsuk Kim, Yongin-si (KR); Taehyun Kim, Yongin-si (KR); Suyeon Sim, Yongin-si (KR); Joosun Yoon, Yongin-si (KR); Seungmin Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/241,803

(22) Filed: Aug. 19, 2016

(65) Prior Publication Data

US 2017/0053973 A1    Feb. 23, 2017

(30) Foreign Application Priority Data

Aug. 19, 2015    (KR) .................. 10-2015-0116846

(51) Int. Cl.
    *H01L 27/32*    (2006.01)
    *H01L 51/52*    (2006.01)
    *H01L 51/56*    (2006.01)

(52) U.S. Cl.
    CPC ...... *H01L 27/3246* (2013.01); *H01L 51/5206* (2013.01); *H01L 51/5237* (2013.01);
    (Continued)

(58) Field of Classification Search
    CPC ............ H01L 27/3246; H01L 27/3283; H01L 51/5237; H01L 51/5253; H01L 51/5256; H01L 51/5246; H01L 51/525
    See application file for complete search history.

(56) References Cited

U.S. PATENT DOCUMENTS 8,536,589 B2 * 9/2013 Matsushima ....... H01L 27/3246
                                                            257/88
8,546,820 B2 * 10/2013 Matsushima ....... H01L 27/3246
                                                            257/88

(Continued)

FOREIGN PATENT DOCUMENTS

JP        2010-282899 A    12/2010
KR   10-2008-0048751 A     6/2008
(Continued)

*Primary Examiner* — Victoria K Hall
(74) *Attorney, Agent, or Firm* — F. Chau & Associates, LLC

(57) ABSTRACT

An organic light-emitting display apparatus includes a substrate divided into a display area and a peripheral area that is around the display area. Pixels are formed over the display area. For each pixel, a thin film transistor is provided. An insulation film covers the thin film transistor. Each pixel includes a pixel electrode disposed on the insulation film and electrically connected to the thin film transistor, a pixel defining layer covering an edge area of the pixel electrode, an opposite electrode facing the pixel electrode, and an organic light-emitting layer disposed between the pixel electrode and the opposite electrode. The pixel defining layer includes an opening to expose a center area of the pixel electrode, a first inclination portion, and a second inclination portion. An end of the pixel electrode is disposed between the insulation film and the second inclination portion.

24 Claims, 12 Drawing Sheets

(52) U.S. Cl.
CPC ...... *H01L 51/5246* (2013.01); *H01L 51/5253* (2013.01); *H01L 51/56* (2013.01)

(56) References Cited

U.S. PATENT DOCUMENTS

| | | | | |
|---|---|---|---|---|
| 8,546,821 | B2* | 10/2013 | Matsushima | H01L 27/3246 257/88 |
| 9,123,676 | B2* | 9/2015 | Han | H01L 27/3248 |
| 2005/0046346 | A1* | 3/2005 | Tsuchiya | H01L 27/3244 313/509 |
| 2009/0295280 | A1* | 12/2009 | Yang | H01L 51/5284 313/504 |
| 2010/0045173 | A1* | 2/2010 | Kwon | H01L 27/3246 313/504 |
| 2011/0198596 | A1 | 8/2011 | Park | |
| 2012/0049169 | A1 | 3/2012 | Kim | |
| 2013/0075737 | A1 | 3/2013 | Hong | |
| 2013/0334959 | A1* | 12/2013 | Wang | H01L 51/5256 313/512 |
| 2014/0034923 | A1* | 2/2014 | Kim | H01L 27/3297 257/40 |
| 2014/0131683 | A1* | 5/2014 | Kim | H01L 51/5253 257/40 |
| 2016/0064686 | A1* | 3/2016 | Odaka | H01L 51/5246 257/89 |
| 2016/0099300 | A1 | 4/2016 | Lee et al. | |
| 2016/0190225 | A1* | 6/2016 | Kim | H01L 27/3276 257/40 |
| 2017/0012243 | A1* | 1/2017 | Suzuki | H01L 51/5259 |
| 2017/0031323 | A1* | 2/2017 | Kim | G04G 9/10 |
| 2017/0154934 | A1* | 6/2017 | Kim | H01L 51/525 |
| 2017/0256597 | A1* | 9/2017 | Lee | H01L 27/3276 |

FOREIGN PATENT DOCUMENTS

| | | |
|---|---|---|
| KR | 10-2011-0094460 A | 8/2011 |
| KR | 10-2012-0019024 A | 3/2012 |
| KR | 10-2013-0032112 A | 4/2013 |

* cited by examiner

ORGANIC LIGHT-EMITTING DISPLAY APPARATUS INCLUDING PIXEL DEFINING LAYER HAVING FIRST AND SECOND INCLINATION PORTIONS AND METHOD OF MANUFACTURING THE SAME

CROSS-REFERENCE TO RELATED APPLICATION

This application claims the benefit of Korean Patent Application No. 10-2015-0116846, filed on Aug. 19, 2015, in the Korean Intellectual Property Office, the disclosure of which is incorporated herein in its entirety by reference.

BACKGROUND

1. Field

One or more embodiments relate to an organic light-emitting display apparatus and a method of manufacturing the same, and more particularly, to an organic light-emitting display apparatus with low manufacturing costs by reducing the number of masks, and a method of manufacturing the same.

2. Discussion of the Related Technology

An organic light-emitting display apparatus includes an organic light-emitting device including a hole injection electrode, an electron injection electrode, and an organic light-emitting layer disposed between the hole injection electrode and the electron injection electrode. The organic light-emitting display apparatus is a self-luminous type display apparatus that emits light when electrons of the electron injection electrode and holes of the hole injection electrode combine in the organic light-emitting layer to generate excitons and when the generated excitons are dropped from an excited state to a ground state.

Since the organic light-emitting display apparatus of a self-luminous type display apparatus does not need a back light source, the organic light-emitting display apparatus operates with a low voltage and is thin and lightweight. Since the organic light-emitting display apparatus has excellent characteristics in viewing angles, contrast, and response times, the organic light-emitting display apparatus is applied to various apparatuses, for example, a personal portable device, such as an MP3 player and a smart phone, and a TV.

Since manufacturing costs are reduced, demands for the organic light-emitting display apparatus with a high resolution have increased.

SUMMARY

One or more embodiments include an organic light-emitting display apparatus with a high resolution realized by low manufacturing costs, and a method of manufacturing the same.

One aspect provides an organic light-emitting display apparatus, which may comprise: a substrate comprising a surface which comprises a display area and a peripheral area that is around the display area; a thin film transistor disposed over the display area of the substrate; an insulation film disposed over the thin film transistor; a pixel electrode disposed over the insulation film and electrically connected to the thin film transistor; a pixel defining layer disposed over the pixel electrode and comprising an opening to expose a center area of the pixel electrode, the pixel defining layer comprising an inner edge, an outer edge, a convex portion between the inner edge and the outer edge, a first inclination portion extended from the inner edge toward the convex portion and a second inclination portion extended from the outer edge toward the convex portion; an opposite electrode facing the pixel electrode; and an organic light-emitting layer disposed between the pixel electrode and the opposite electrode, wherein the pixel electrode comprises an end disposed between the insulation film and the second inclination portion, and the second inclination portion overlaps the end of the pixel electrode when viewed in a viewing direction perpendicular to the surface of the substrate.

In the foregoing apparatus, a first angle between the pixel electrode and the first inclination portion may be greater than a second angle between the insulation film and the second inclination portion. The first angle may be smaller than about 55 degrees and the second angle may be smaller than about 40 degrees. A difference between the first angle and the second angle may be greater than about 5 degrees. When viewed in the viewing direction, a distance between the inner edge of the pixel defining film and the end of the pixel electrode may be longer than a distance between the outer edge of the pixel defining film and the end of the pixel electrode.

Still in the foregoing apparatus, the apparatus may further comprise: at least one dam portion disposed over the peripheral area of the substrate, wherein the dam portion comprises a first dam insulation layer, a second dam insulation layer, and a floating conductor disposed between the first dam insulation layer and the second dam insulation layer, and wherein the first dam insulation layer, the floating conductor, and the second dam insulation layer comprise the same materials as the insulation film, the pixel electrode, and the pixel defining layer, respectively. The floating conductor may be disposed on the first dam insulation layer and completely covered by the second dam insulation layer when viewed in the viewing direction. The apparatus may further comprise another dam portion, wherein the dam portion is disposed between the other dam portion and the display area when viewed the viewing direction.

Yet in the foregoing apparatus, the apparatus may further comprise a thin film encapsulation layer disposed over the opposite electrode and comprising at least one inorganic film and at least one organic film. The apparatus may comprise an array of pixels formed over the display area of the substrate, each pixel comprising the pixel electrode, the organic light-emitting layer and the opposite electrode, wherein the at least one inorganic film may cover the array of pixels formed over the display area of the substrate and the dam portion surrounding the array of pixels. The apparatus may further comprise: a wiring line comprising the same material as the pixel electrode, and spaced apart from the pixel electrode; and a wiring insulation layer disposed to completely cover the wiring line and patterned to correspond to the wiring, wherein the wiring insulation layer comprises the same material as the pixel defining layer and is spaced apart from the pixel defining layer. The apparatus may further comprise: a capacitor disposed to overlap the thin film transistor when viewed in the viewing direction, wherein the thin film transistor comprises an active layer disposed over the substrate and a gate electrode disposed over at least a portion of the active layer and insulated from the active layer, and wherein an upper capacitor electrode is disposed over the gate electrode to form a capacitor together with the gate electrode.

Another aspect provides an organic light-emitting display apparatus, which may comprise: a substrate comprising a surface which comprises a display area and a peripheral area that is around the display area; a thin film transistor disposed over the display area of the substrate; an insulation film disposed over the thin film transistor; a pixel electrode disposed over the insulation film and electrically connected to the thin film transistor; a pixel defining layer disposed over the pixel electrode; an opposite electrode facing the pixel electrode; an organic light-emitting layer disposed between the pixel electrode and the opposite electrode; and a dam portion disposed over the peripheral area of the substrate, wherein the dam portion comprises: a first dam insulation layer comprising the same material as the insulation film and spaced apart from the insulation film; a floating conductor disposed over the first dam insulation layer, comprising the same material as the pixel electrode, and spaced apart from the pixel electrode; and a second insulation film comprising the same material as the pixel defining layer and spaced apart from the pixel defining layer.

In the foregoing apparatus, the floating conductor may be disposed over the first dam insulation layer and is completely covered by the second dam insulation layer. The apparatus may further comprise: a thin film encapsulation layer disposed over the opposite electrode and including at least one inorganic film and at least one organic film. The at least one inorganic film may cover the display area and the dam portion. The at least one inorganic film may cover the dam portion and directly contact the surface of the substrate. The pixel defining layer may comprise an opening to expose a center area of the pixel electrode; wherein the pixel defining layer comprises an inner edge, an outer edge, a convex portion between the inner edge and the outer edge, a first inclination portion extended from the inner edge toward the convex portion and a second inclination portion extended from the outer edge toward the convex portion; and wherein the pixel electrode comprises an end disposed between the insulation film and the second inclination portion, and the second inclination portion overlaps the end of the pixel electrode when viewed in a viewing direction perpendicular to the surface of the substrate.

Still in the foregoing apparatus, a first angle between the pixel electrode and the first inclination portion may be greater than a second angle between the insulation film and the second inclination portion. When viewed in the viewing direction, a distance from the inner edge of the pixel defining film and the end of the pixel electrode may be longer than a distance between the outer edge of the pixel defining film and the end of the pixel electrode. The pixel defining layer may comprise a photosensitive organic material. The apparatus may further comprise another dam portion, wherein the dam portion is disposed between the other dam portion and the display area when viewed a viewing direction perpendicular to the surface of the substrate.

A further aspect provides a manufacturing method of an organic light-emitting display apparatus, which may comprise: providing a substrate comprising a surface which comprises a display area and a peripheral area that is around the display area; forming a thin film transistor over the display area of the substrate; forming a first insulation material over the thin film transistor; patterning the first insulation material to form an insulation film disposed over the display area and a first dam insulation layer disposed over the peripheral area and spaced apart from the insulation film; forming a conductive material over the insulation film and the first dam insulation layer; forming a second insulation material over the conductive material; irradiating light to the second insulation material and removing at least a portion of the second insulation material to expose the conductive material; etching an exposed area of the conductive material to form a pixel electrode and a floating conductor spaced apart from the pixel electrode; reflowing the second insulation material to form a pixel defining layer over the pixel electrode and a second dam insulation layer over the floating conductor; forming an organic light-emitting layer over the pixel electrode; and forming an opposite electrode over the organic light-emitting layer.

In the foregoing method, the irradiating light to the second insulation material may comprise: irradiating the light to the second insulation material using a half tone mask having a light transmitting portion, a semi light transmitting portion, and a light shielding portion. The manufacturing method may further comprise: etching the exposed area of the conductive material to form a wiring line, wherein when forming the wiring line, the pixel electrode and the floating conductor are simultaneously formed. The manufacturing method may further comprise forming a thin film encapsulation layer comprising at least one inorganic film and at least one organic film after forming the opposite electrode.

Additional aspects are set forth in part in the description which follows and, in part, are apparent from the description, or may be learned by practice of the presented embodiments.

According to one or more embodiments, an organic light-emitting display apparatus may include a substrate which is divided into a center area including a display area to display an image and a peripheral area disposed around the center area, a thin film transistor disposed in the display area of the substrate, a via insulation film disposed to cover the thin film transistor, a pixel electrode disposed on the via insulation film and electrically connected to the thin film transistor, a pixel defining layer disposed to cover an edge area of the pixel electrode, including an opening to expose a center area of the pixel electrode, a first inclination portion extended from an area where an upper surface of the pixel electrode and the opening contact, and a second inclination portion extended from the first inclination portion to an area of an upper surface of the via insulation film in a direction different from an inclination direction of the first inclination portion, an opposite electrode facing the pixel electrode, and an organic light-emitting layer disposed between the pixel electrode and the opposite electrode, wherein an end of the pixel electrode is disposed the via insulation film and the second inclination portion.

According to one or more embodiments, a first angle between the pixel electrode and the first inclination portion may be greater than a second angle between the via insulation film and the second inclination portion.

According to one or more embodiments, the first angle may be smaller than about 55 degrees and the second angle is smaller than about 40 degrees.

According to one or more embodiments, a difference between the first angle and the second angle is greater than about 5 degrees.

According to one or more embodiments, a distance from the area where the upper surface of the pixel electrode and the opening contact to the end of the pixel electrode, which is covered by the pixel defining layer, may be longer than a distance from the area of the upper surface of the via insulation film to the end of the pixel electrode.

According to one or more embodiments, the organic light-emitting display apparatus may further include at least one dam portion disposed on the peripheral area of the substrate, and the dam portion may include a first insulation film, a second insulation film, and a floating conductor disposed between the first insulation film and the second insulation film. The first insulation film, the floating conductor, and the second insulation film may include the same material disposed in the same layer as the via insulation film, the pixel electrode, and the pixel defining layer, respectively.

According to one or more embodiments, the floating conductor may be disposed on the first insulation film and completely covered by the second insulation film.

According to one or more embodiments, the dam portion may include a plural dam portion.

According to one or more embodiments, the organic light-emitting display apparatus may further include a thin film encapsulation layer disposed on the opposite electrode and comprising at least one inorganic film and at least one organic film.

According to one or more embodiments, the at least one inorganic film may be extended from the center area of the substrate to be disposed on the dam portion of the peripheral area of the substrate.

According to one or more embodiments, the organic light-emitting display apparatus may further include a wiring disposed in the center area of the substrate, including the same material as the pixel electrode, and spaced apart from the pixel electrode, and a third insulation film disposed to completely cover the wiring and patterned to correspond to the wiring. The third insulation film may include the same material as the pixel defining layer and is spaced apart from the pixel defining layer.

According to one or more embodiments, the organic light-emitting display apparatus may further include a capacitor disposed to overlap the thin film transistor in a plan view, wherein the thin film transistor may include an active layer disposed on the substrate and a gate electrode disposed on at least a portion of the active layer and insulated from the active layer, and wherein an upper electrode may be disposed on the gate electrode to form a capacitor together with the gate electrode.

According to one or more embodiments, an organic light-emitting display apparatus may include a substrate which is divided into a center area including a display area to display an image and a peripheral area disposed around the center area, a thin film transistor disposed in the display area of the substrate, a via insulation film disposed to cover the thin film transistor, a pixel electrode disposed on the via insulation film and electrically connected to the thin film transistor, a pixel defining layer disposed to cover an edge area of the pixel electrode, an opposite electrode facing the pixel electrode, an organic light-emitting layer disposed between the pixel electrode and the opposite electrode, and a dam portion disposed in the peripheral area of the substrate and including a first insulation film including a same material as the via insulation film and spaced apart from the via insulation film, a floating conductor disposed on the first insulation film, including a same material as the pixel electrode, and spaced apart from the pixel electrode, and a second insulation film including a same material as the pixel defining layer and spaced apart from the pixel defining layer.

According to one or more embodiments, the floating conductor may be disposed on the first insulation film and completely covered by the second insulation film.

According to one or more embodiments, the organic light-emitting display apparatus may further include a thin film encapsulation layer disposed on the opposite electrode and including at least one inorganic film and at least one organic film.

According to one or more embodiments, the at least one inorganic film may be extended from the center area and disposed on the dam portion in the peripheral area.

According to one or more embodiments, the at least one inorganic film may be extended from the dam portion to directly contact an upper surface of the substrate.

According to one or more embodiments, the pixel defining layer may include an opening to expose a center area of the pixel electrode, the pixel defining layer may include a first inclination portion extended from an area where an upper surface of the pixel electrode and the opening contact, and a second inclination portion extended from the first inclination portion to an area of an upper surface of the via insulation film in a direction different from an inclination direction of the first inclination portion, and an end of the pixel electrode may be disposed between the via insulation film and the second inclination portion.

According to one or more embodiments, a first angle between the pixel electrode and the first inclination portion may be greater than a second angle between the via insulation film and the second inclination portion.

According to one or more embodiments, a distance from the area where the upper surface of the pixel electrode and the opening contact to the end of the pixel electrode, which is covered by the pixel defining layer, may be longer than a distance from the area of the upper surface of the via insulation film to the end of the pixel electrode.

According to one or more embodiments, the pixel defining layer may include a photosensitive organic material.

According to one or more embodiments, the dam portion may include a plural dam portion.

According to one or more embodiments, a manufacturing method of an organic light-emitting display apparatus may include providing substrate which is divided into a center area including a display area to display an image and a peripheral area disposed around the center area, forming a thin film transistor in the display area of the substrate, forming a first insulation material to cover the thin film transistor, patterning the first insulation material to form a via insulation film disposed in the display area and a first insulation film disposed in the peripheral area and spaced apart from the via insulation film, forming a conductive material on the via insulation film, forming a second insulation material on the conductive material, irradiating light to the second insulation material and removing a portion of the second insulation material to expose the conductive material, etching an exposed area of the conductive material to form a pixel electrode and a floating conductor spaced apart from the pixel electrode, reflowing the second insulation material to form a pixel defining layer covering an edge portion of the pixel electrode and a second insulation film covering the floating conductor, forming an organic light-emitting layer on the pixel electrode, and forming an opposite electrode on the organic light-emitting layer.

According to one or more embodiments, the irradiating light to the second insulation material may include irradiating the light to the second insulation material using a half tone mask having a light transmitting portion, a semi light transmitting portion, and a light shielding portion.

According to one or more embodiments, the manufacturing method may further include etching the exposed area of the conductive material to form a wiring, and the forming the wiring may be performed to simultaneously form the pixel electrode and the floating conductor.

According to one or more embodiments, the manufacturing method may further include forming a thin film encapsulation layer including at least one inorganic film and at least one organic film after forming the opposite electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
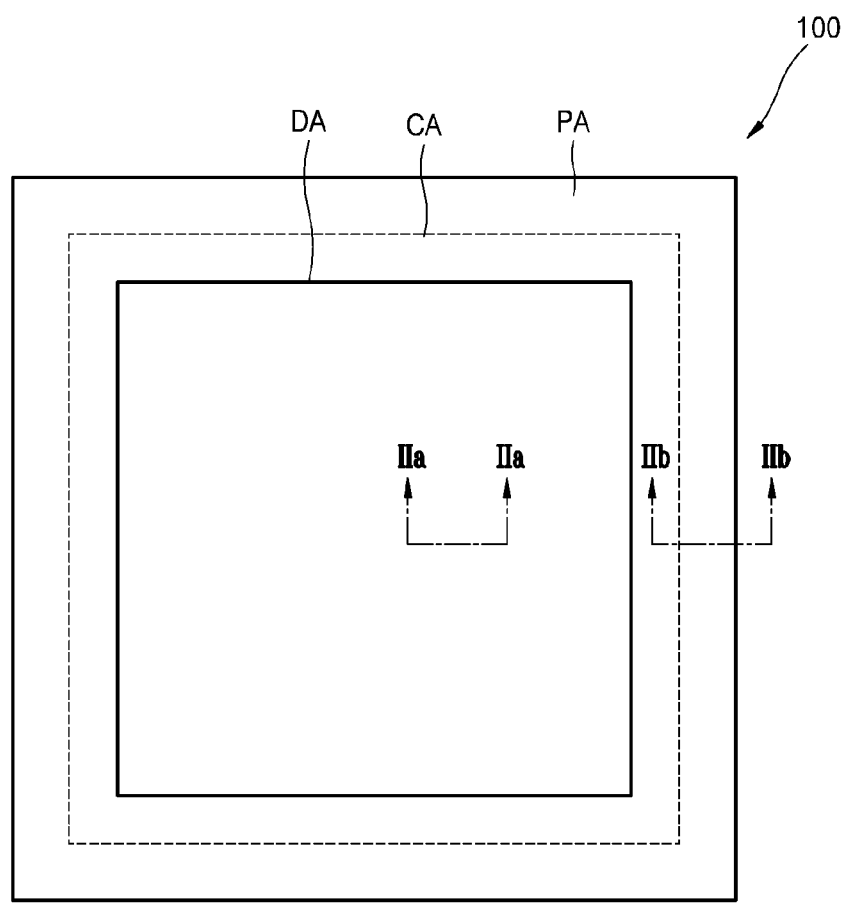
FIG. 1 is a plan view schematically illustrating an organic light-emitting display apparatus according to an embodiment of the present inventive concept.

The present embodiments may have different forms and embodiments and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being formed or disposed "on," another layer, region, or component, it can be directly formed or disposed on and directly contact the other layer, region, or component, or indirectly formed or disposed above the other layer, region or component. For example, one or more intervening layers, regions, or components may be present between the layer, region or component and the other layer, region or component.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Reference will now be made in detail to embodiments, examples of which are illustrated in the accompanying drawings, wherein like reference numerals refer to like elements throughout.

Figure 2:
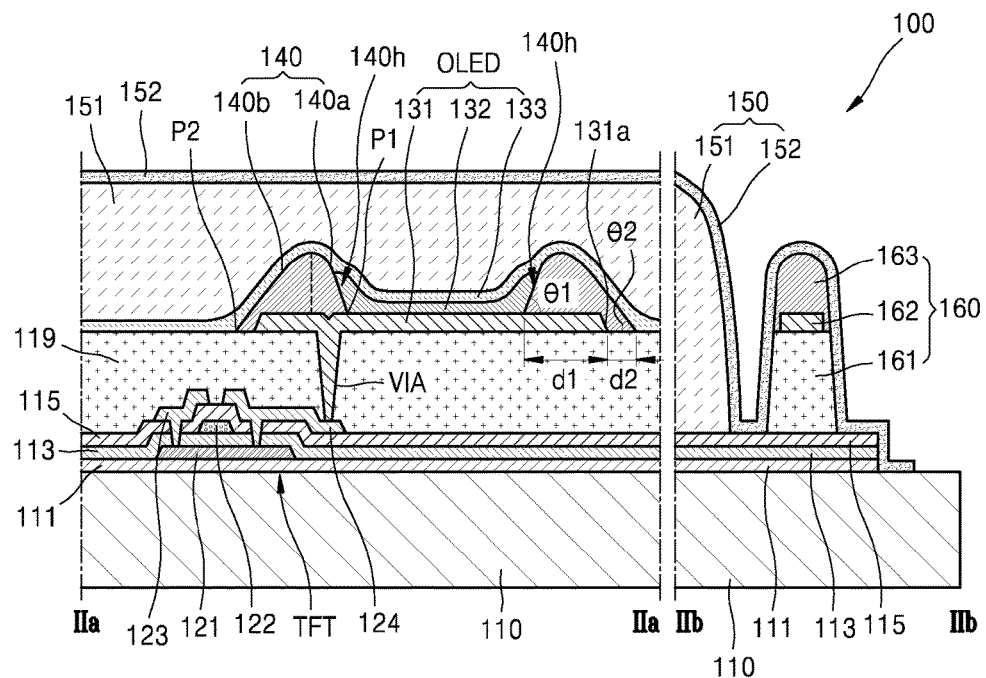
FIG. 2 is a cross-sectional view taken along a line IIa-IIa and a line IIb-IIb of FIG. 1.

FIG. 1 is a plan view schematically illustrating an organic light-emitting display apparatus 100 according to an embodiment of the present inventive concept, and FIG. 2 is a cross-sectional view taken along a line IIa-IIa and a line IIb-IIb of FIG. 1.

Referring to FIGS. 1 and 2, the organic light-emitting display apparatus 100 may include a substrate 110 which is divided into a peripheral area and a center area CA including a display area DA, the peripheral area PA surrounding the center area CA, thin film transistors TFTs disposed in the display area DA, a via insulation film 119 disposed to cover the thin film transistor TFT, a pixel electrode 131 disposed on the via insulation film 119 and electrically connected to the thin film transistor TFT, a pixel define layer 140 disposed on the via insulation film 119 and covering an edge area of the pixel electrode 131, including an opening 140h to expose a center area of the pixel electrode 131, and including a first inclination portion 140a extended from an area P1 at a contact portion between an upper surface of the pixel electrode 131 and the opening 140h and a second inclination portion 140b extended from the first inclination portion 140a to an area P2 on an upper surface of the via insulation film 119 in an inclination direction different from an inclination direction of the first inclination portion 140a, an opposite electrode 133 facing the pixel electrode 131, and an organic light-emitting layer 132 disposed between the pixel electrode 131 and the opposite electrode 133. An end 131a of the pixel electrode 131 may be disposed between the via insulation film 119 and the second inclination portion 140b.

The substrate 110 may include various materials, for example, glass, metal, or plastic. According to one embodiment, the substrate 110 may be a substrate including a flexible material. Here, the flexible substrate 110 may be flexible, bendable, foldable, and rollable. The flexible substrate 110 may include ultra-thin glass, metal or plastic. When the substrate 110 includes plastic, the substrate 110 may include polyimide (PI), but is not limited thereto.

The substrate 110 may be divided into the peripheral area PA and the center area CA. In detail, the peripheral area PA is adjacent to an edge portion of the substrate 110, and the center area CA is an internal area of the peripheral area PA. The center area CA may include the display area DA over which an array of pixels is formed.

A plurality of pixels are arranged in the display area DA, and each pixel may include an organic light-emitting device OLED to realize an image. According to one embodiment, a non-display area including a driver and a pad portion may surround the display area DA.

A buffer film 111 may be disposed on the substrate 110 to prevent, minimize or reduce permeation of impurities and to planarize a surface of the substrate 110. The thin film transistor TFT may be disposed on the display area DA of the buffer film 111. A barrier layer may be disposed between the substrate 110 and the buffer film 111. The buffer film 111 may be omitted if necessary.

The thin film transistor TFT may function as a portion of a driving circuit to drive the organic light-emitting device OLED, and the driving circuit may include a capacitor and wiring line in addition to the thin film transistor TFT.

The thin film transistor TFT may include an active layer 121 disposed on the buffer film 111, a gate electrode 122 disposed on at least a portion of the active layer 121, a source electrode 123 receiving a data signal, and a drain electrode 124 electrically connected to the pixel electrode 131. A gate insulation film 113 may be disposed between the active layer 121 and the gate electrode 122, and an interlayer insulation film 115 may be disposed between the gate electrode 122 and the source electrode 123 and between the gate electrode 122 and the drain electrode 124.

The active layer 121 may include a semiconductor material, for example, amorphous silicon or poly crystalline silicon, however, the present inventive concept is not limited thereto. According to one embodiment, the active layer 121 may include an organic semiconductor material or an oxide semiconductor material.

The gate electrode 122 may be connected to a gate wiring line to apply an on/off signal to the thin film transistor TFT and may include a low-resistance metal material. For example, the gate electrode 122 may be a single film or a multi film including molybdenum (Mo), aluminum (Al), copper (Cu), and/or titanium (Ti).

The source electrode 123 and the drain electrode 124 may be a single film or a multi film including a conductive material having a good conductivity and may be connected to a source area and a drain area of the active layer 121, respectively.

According to one embodiment, the thin film transistor TFT may be a top gate-type transistor in which the gate electrode 122 is disposed above the active layer 121. However, the present inventive concept is not limited thereto. According to another embodiment, the thin film transistor TFT may be a bottom gate-type transistor in which the gate electrode 122 is disposed below the active layer 121.

The gate insulation film 113 and the interlayer insulation film 115 may be a single film or a multi film including an inorganic compound, for example, silicon dioxide ($SiO_2$), silicon nitride ($SiN_x$), silicon nitride oxide (SiON), aluminum oxide ($Al_2O_3$), titanium oxide ($TiO_2$), tantalum oxide ($Ta_2O_5$), hafnium oxide ($HfO_2$), and/or zirconium oxide ($ZrO_2$).

The buffer film 111, the gate insulation film 113, and the interlayer insulation film 115 may be disposed in the display area DA and may be extended to the peripheral area PA. According to one embodiment, the buffer film 111, the gate insulation film 113, and the interlayer insulation film 115 may be disposed in an area of the substrate 110 except an outermost edge area of the substrate 110.

The via insulation film 119 covers the thin film transistor TFT and may eliminate steps formed by the thin film transistor TFT and planarize an upper surface of the thin film transistor TFT. The via insulation film 119 may be a single film and a multi film including an organic compound. However, the present inventive concept is not limited thereto. According to other embodiment, the via insulation film 119 may be a composite laminate including an inorganic insulation film and an organic insulation film.

The pixel electrode 131 may be disposed on the via insulation film 119 and be electrically connected to the thin film transistor TFT through a via hole VIA formed in the via insulation film 119. According to one embodiment, the pixel electrode 131 is electrically connected to the drain electrode 124. However, the present inventive concept is not limited thereto. According to another embodiment, the pixel electrode 131 may be electrically connected to the source electrode 123.

The pixel electrode 131 may include a material having a high work function. If the pixel electrode 131 is a bottom emission-type electrode that displays an image in a bottom direction of the substrate 110, the pixel electrode 131 may include at least one transparent conductive oxide selected from a group including indium tin oxide (ITO), indium zinc oxide (IZO), zinc oxide (ZnO), indium oxide ($In_2O_3$), indium gallium oxide (IGO), and aluminum zinc oxide (AZO).

According to another embodiment, if the pixel electrode 131 is a top emission-type electrode that displays an image in a top direction of the substrate 110, the pixel electrode 131 may include the above-described transparent conductive oxide and also further include a metal reflective film including silver (Ag), magnesium (Mg), aluminum (Al), platinum (Pt), lead (Pd), gold (Au), Nickel (Ni). Neodymium (Nd), iridium (Ir), or chrome (Cr).

The pixel defining layer 140 may cover an edge area of the pixel electrode 131 and include an opening 140h through which the center area of the pixel electrode 131 is exposed. The pixel defining layer 140 may further include a first inclination portion 140a, which is extended from the area P1where the upper surface of the pixel electrode 131 and the opening 140h contact, in an inclination direction, and a second inclination portion 140b, which is extended from the first inclination portion 140a to the area P2of the upper surface of the via insulation film 119 in a direction different from the inclination direction of the first inclination portion 140a.

The first inclination portion 140a may be extended from an area in which the upper surface of the pixel electrode 131 and the opening 140h contact, in a direction away from the substrate 110. The second inclination portion 140b may be extended from the first inclination portion 140a in a direction toward the substrate 110. Here, the direction away from the substrate 110 and the direction toward the substrate 110 may not be a direction perpendicular to the substrate 110 but a direction inclined by a certain degree with respect to a major surface of the substrate 110.

The pixel defining layer 140 may cover a circumferential edge portion of the pixel electrode 131 and expose the upper surface of the pixel electrode 131. When viewed in a viewing direction from above in a plan view, the pixel defining layer 140 may have a donut shape, an annular shape or a rectangular frame shape. The pixel defining layer 140 may be a photosensitive organic compound which may include polyimide (PI), for example.

In embodiments, the pixel defining film 140 includes an inner edge, an outer edge and a convex portion located between the inner edge and the outer edge when viewed in the viewing direction perpendicular to a surface of the substrate. Each of the inner edge, the outer edge and the convex portion form a closed loop line when viewed in the viewing direction. Thus, in embodiments, the inner edge defines and surrounds the opening through which the central portion of the pixel electrode is exposed, the convex portion surrounds the inner edge, and the outer edge surrounds the convex portion when viewed in the direction. Further, in embodiments, the outer edge surrounds the edge of the pixel electrode when viewed in the viewing direction. In embodiments, the first inclination portion 140a ascends from the inner edge toward the convex portion, while the second inclination portion 140b ascends from the outer edge toward the convex portion.

The pixel electrode 131 may be disposed in most areas between the pixel define layer 140 and the via insulation film 119. An area where the pixel define layer 140 and the via insulation 119 contact may be a small area, compared to an area where the pixel electrode 131 is disposed. In embodiments, the area or region P2 of the upper surface of the via insulation film 119 may be adjacent to an end 131a of the pixel electrode 131.

The edge area of the pixel electrode 131 is between the via insulation film 119 and the first inclination portion 140a of the pixel define layer 140 and also extended to be between the via insulation film 119 and the at least a portion of the second inclination portion 140b of the pixel definition portion 140. In embodiments, the end 131a of the pixel electrode 131 may be disposed between the via insulation film 119 and the second inclination portion 140b. A distance d1 from the area or region P1 of the upper surface of the pixel electrode 131 to the end 131a of the pixel electrode 131, which is covered by the pixel define layer 140, may be greater than a distance d2 from the area P2 of the upper surface of the via insulation film 119 to the end 131a of the pixel electrode 131.

According to one embodiment, a first angle θ1 formed between the pixel electrode 131 and the first inclination portion 140a may be greater than a second angle θ2 formed between the via insulation film 119 and the second inclination portion 140b. The first angle θ1 may be smaller than about 55 degrees, and the second angle θ2 may be smaller than about 40 degrees. A difference between the first angle θ1 and the second angle θ2 may be greater than about 5 degrees.

The first inclination portion 140a and the second inclination portion 140b may have different slopes according to areas of the pixel defining layer 140. In the different slopes, the first angle θ1 and the second angle θ2 represent angles of the pixel defining layer 140 at the area P1 of the upper surface of the pixel electrode 131 and the area P2 of the upper surface of the via insulation film 119, respectively.

However, in embodiments, the pixel defining layer 140 may have an area which may be substantially parallel to the via insulation film 119 and/or the pixel electrode 140 along the upper surface of the via insulation film 119 and/or the upper surface of the pixel electrode 140 during a process of forming the pixel defining layer 140. The area of the pixel defining layer 140 may be excluded from an area of the pixel defining layer 140 to define the above-described angles. The term "substantially parallel" may mean that an angle formed between the first inclination portion 140a of the pixel defining layer 140 and the pixel electrode 131 is smaller than about 5 degrees or an angle formed between the second inclination portion 140b of the pixel defining layer 140 and the via insulation film 119 is smaller than about 5 degrees.

In embodiments, the opening defined by the ring-shaped pixel defining film 140 may be filled with a material, for example, an organic light emitting diode material. The organic light-emitting layer 132 may be disposed on an area of the pixel electrode 131 which is not covered by the pixel defining layer 140.

The organic light-emitting layer 132 may be a low molecular organic compound or a high molecular organic compound. At least one of a hole injection layer, a hole transport layer, an electron transport layer, and an electron injection layer may be disposed between the pixel electrode 131 and the opposite electrode 133. According to one embodiment, in addition to the above-described layers, one or more various functional layers may be disposed between the pixel electrode 131 and the opposite electrode 133.

The organic light-emitting layer 132 may be disposed in the corresponding organic light-emitting device OLED. In this case, the organic light-emitting device OLED may emit red, green, or blue light according to a kind of the organic light-emitting layer 132 included in the organic light-emitting device OLED. However, the present inventive concept is not limited thereto. The organic light-emitting device OLED may include a plurality of organic light-emitting layers 132. For example, a plurality of the organic light-emitting layers 132 emitting the red, green, and blue light may be vertically stacked to generate white light. In this case, a color conversion layer or a color filter may be further included in the organic light-emitting device OLED and convert the emitted white light into a certain color. The red, green, and blue light are exemplary, and a combination of colors to emit the white light is not limited to the red, green, and blue light.

The opposite electrode 133 is disposed on the organic light-emitting layer 132 and may include various conductive materials. For example, the opposite electrode 133 may include at least one selected from a group consisting of lithium (Li), calcium (Ca), Lithium fluoride (LiF), aluminum (Al), magnesium (Mg), and silver (Ag) and may be a single layer or a multilayer. In a bottom emission-type electrode, the opposite electrode 133 may be a reflective electrode, and in a top emission-type electrode, the opposite electrode 133 may be a transparent or translucent electrode. In embodiments, the opposite electrode 133 may be a common electrode for the plurality of pixels.

According to one embodiment, an encapsulation layer 150 may be disposed on the opposite electrode 133 and seal the organic light-emitting device OLED. The encapsulation layer 150 may include at least one organic film 151 and at least one inorganic film 152. The encapsulation layer 150 may seal the organic light-emitting device OLED to prevent or inhibit the organic light-emitting device OLED from being exposed to air or foreign material, may have a very small thickness, and may be usable as an encapsulation unit of a flexible display apparatus, which is bendable or foldable.

According to one embodiment, the inorganic film 152 may include oxide, nitride, or nitrogen oxide, such as silicon nitride (SiNx), silicon oxide ($SiO_2$), or silicon oxy nitride (SiOxNy). The inorganic film 152 may prevent, minimize or reduce permeation of a foreign material, such as moisture or oxygen, into the organic light-emitting device OLED and may be extended from the display area DA to the peripheral area PA.

At least a portion of the inorganic film 152 may directly contact the interlayer insulation film 115 in the peripheral area PA. In addition, the inorganic film 152 may be disposed on end portions of the gate insulation film 113 and the interlayer insulation film 115 and extended to an outermost edge area of the substrate 110. The inorganic film 152 may be extended to an area where the inorganic film 152 directly contacts the substrate 110.

In embodiments, an edge area of the inorganic film 152 contacts an upper surface of the substrate 110. According to the direct contact between the edge area of the inorganic film 152 and the upper surface of the substrate 110, detachment of the inorganic film 152 from the interlayer insulation film 115 may be reduced, avoided or prevented and an encapsulation characteristic of the thin film encapsulation layer 150 may be improved.

The organic film 151 of the thin film encapsulation layer 150 may be disposed between the opposite electrode 133 and the inorganic film 152 and prevent, minimize or reduce permeation of foreign materials such as moisture or oxygen into the organic light-emitting device OLED. The organic film 151 may improve encapsulation characteristics together with the inorganic film 152 and may planarize an uneven surface of the organic light-emitting device OLED. According to one embodiment, the organic film 151 may include various organic compounds such as epoxy-based resin, acryl-based resin, or polyimide-based resin.

According to one embodiment, a function layer or a protection layer may be further provided between the opposite electrode 133 and the thin film encapsulation layer 150. The functional layer may include a capping layer and/or a LiF layer and control a refractive index of visible light emitted from the organic light-emitting device OLED to improve a light efficiency of the organic light-emitting device OLED. The protection layer may include an inorganic compound such as aluminum oxide.

A dam portion 160 may be disposed on the peripheral area PA of the substrate 110. In embodiments, the dam portion 160 may surround the display area when viewed in the viewing direction. The dam portion 160 is formed on the insulating film 115 and spaced from the organic film 151, and thus, in embodiments, a trench or moat is formed around the multi-layered structure formed over the display area and the dam portion 160.

The dam portion 160 may include a first insulation film 161, a second insulation film 163, and a floating conductor 162 disposed between the first insulation film 161 and the second insulation film 163. The first insulation film 161, the floating conductor 162, and the second insulation film 163 may include the same materials and disposed in the same layers as the via insulation film 119, the pixel electrode 131, and the pixel defining layer 140 in the display area DA. The floating conductor 162 may be disposed on the first insulation film 161 and may be completely covered by the second insulation film 163. In embodiments, the floating conductor 162 may be disposed on a portion of an upper surface of the first insulation film 161, and the second insulation film 163 is disposed to cover the floating conductor 162 which is disposed on the first insulation film 161. Another portion of the first insulation film 161, on which the floating conductor 162 is not disposed, may directly contact the second insulation film 163.

The via insulation film 119 and the first insulation film 161, the pixel electrode 131 and the floating conductor 162, and the second insulation film 163 and the pixel defining layer 140 are formed by the same processes, respectively. The first insulation film 161 may include an organic compound, the floating conductor 162 may include a transparent conductive oxide, and the second insulation film 163 may include a photosensitive organic compound, as explained later.

The dam portion 160 is disposed on the peripheral area PA, may be disposed on the interlayer insulation film 115, and may be disposed closer to the edge portion of the substrate 110 than the organic film 151 of the thin film encapsulation layer 150. In embodiments, when the organic film 151 of the thin film encapsulation layer 150 is formed, the dam portion 160 may reduce or prevent an overflow of a material of the organic film 151 in a direction toward the edge portion of the substrate 110. The organic film 151 of the thin film encapsulation layer 150 may be disposed inside the dam portion 160 with respect to the edge portion of the substrate 110.

The inorganic film 152 of the thin film encapsulation layer 150 may be extended from the display area DA to an upper surface of the dam portion 160 and may completely cover the dam portion 160. The inorganic film 152 of the thin film encapsulation layer 150 may be further extended to an edge area of the substrate 110 from the dam portion 160. The inorganic film 152 of the thin film encapsulation layer 150 may also be extended to an area of an upper surface of the interlayer insulation film 115 and directly contact an upper surface of the substrate 110. Areas where the inorganic film 152 directly contacts the interlayer insulation film 115 may be in both opposite directions from the dam portion 160.

Figure 3:
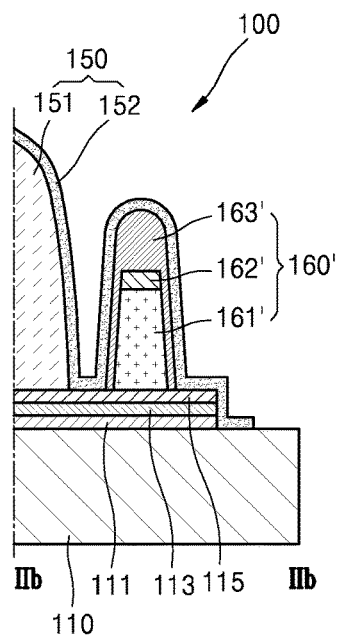
FIG. 3 is a view illustrating a modification example of an area of the line IIb-IIb of FIG. 2.

FIG. 3 is a view illustrating a modification example of an area of the line IIb-IIb of FIG. 2.

Referring to FIG. 3, a dam portion 160' may be disposed on the peripheral area PA of the substrate 110. The dam portion 160' may include a first insulation film 161', a second insulation film 163', and a floating conductor 162' disposed between the first insulation film 161' and the second insulation film 163'. The first insulation film 161', the floating conductor 162', and the second insulation film 163' may include the same materials in the same layers as the via insulation film 119, the pixel electrode 131, and the pixel defining layer 140 which are disposed in the display area DA, respectively. The floating conductor 162' may be disposed on the first insulation film 161' and may be completely covered by the second insulation film 163'.

The floating conductor 162' and the second insulation film 163' of FIG. 3 may be a modification of the floating conductor 162 and the second insulation film 163 of FIG. 2. The floating conductor 162' of FIG. 3 may have substantially the same etching surface as the first insulation film 161', and the second insulation film 163' may be disposed to completely cover the floating conductor 162' and also the first insulation film 161'. In embodiments, an upper surface of the first insulation film 161' may contact the floating conductor 162' and a side surface of the first insulation film 161' may contact the second insulation film 163'.

FIGS. 4A through 4H are cross-sectional views sequentially illustrating a method of manufacturing the organic light-emitting display apparatus of FIG. 2.

Figure 4A:
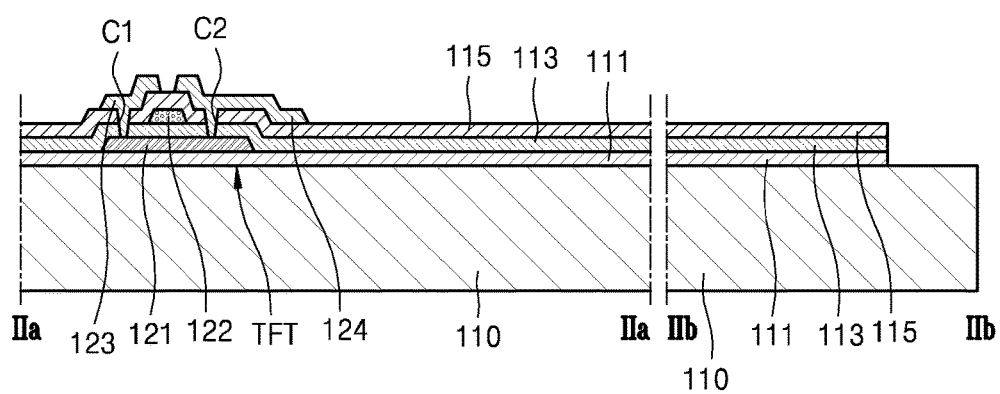
FIGS. 4A through 4H are cross-sectional views sequentially illustrating a method of manufacturing the organic light-emitting display apparatus of FIG. 2.

Referring to FIG. 4A, the thin film transistor TFT may be formed on the substrate 110, which is divided into the center area CA including the display area DA of FIG. 1 over which the plurality of pixels are formed, and the peripheral area PA of FIG. 1, which is around the center area CA.

In detail, after the buffer film 111 is formed on the substrate 110, a semiconductor material is patterned on the buffer film 111 to form the active layer 121. After the active layer 121 is formed, the gate insulation film 113 is formed on the active layer 121, and then a conductive material is patterned on the gate insulation film 113 to form the gate electrode 122. The gate electrode 122 may overlap at least a portion of the active layer 121 in plan view.

After the gate electrode 122 is formed, the interlayer insulation film 115 is formed to cover the gate electrode 122. At least two contact holes C1 and C2 may be formed in the gate insulation film 113 and the interlayer insulation film 115 to expose areas of the active layer 121 by simultaneously etching the gate insulation film 113 and the interlayer insulation film 115.

According to one embodiment, the active layer 121 may include poly crystalline silicon, and the areas which are exposed through the contact holes C1 and C2 may be a source area and a drain area of the active layer 121. The source area and the drain area may be a doped poly silicon area, in embodiments, a conductor area. According to one embodiment, doping may be performed after the gate electrode 122 is formed.

The buffer film 111, the gate insulation film 113, and the interlayer insulation film 115 may be extended from the display area DA to the peripheral area PA. Portions of the buffer film 111, the gate insulation film 113, and the interlayer insulation film 115 disposed in the peripheral area PA may be removed to expose the edge area of the substrate 110. A process of removing the portions of the buffer film 111, the gate insulation film 113, and the interlayer insulation film 115 disposed in the peripheral area PA to expose the edge area of the substrate 110 may be simultaneously performed together with a process of forming the contact holes C1 and C2.

After the contact holes C1 and C2 are formed, a conductive material is disposed on the interlayer insulation film 115 and patterned to form the source electrode 123 and the drain electrode 124 which are connected to the source area and the drain area of the active layer 121, respectively.

Figure 4B:
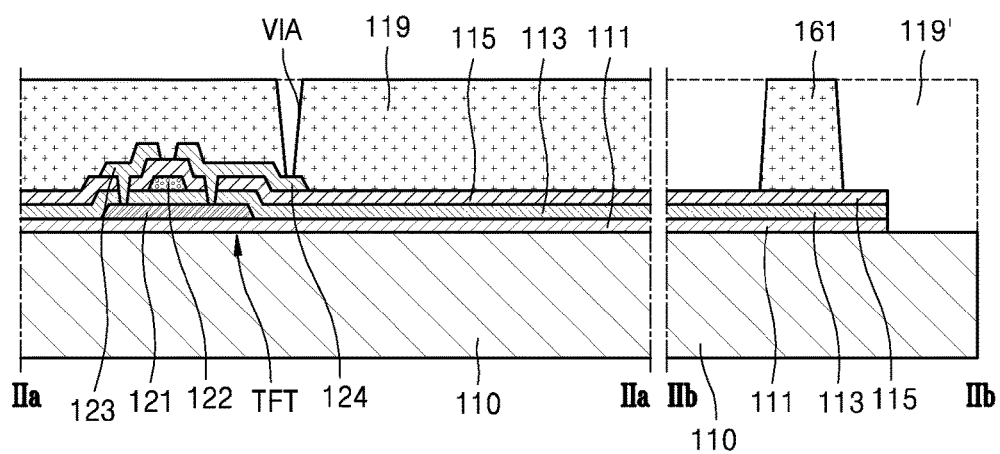

Referring to FIG. 4B, after a first insulation material 119' to cover the thin film transistor TFT is formed, the via insulation film 119 disposed in the display area DA and the first insulation film 161 disposed in the peripheral area PA and spaced apart from the via insulation film 119 may be formed by patterning the first insulation material 119'. The via insulation film 119 and the first insulation film 161 may be a single film or a multi film including an organic compound, and the via insulation film 119 may include the via hole VIA.

Figure 4C:
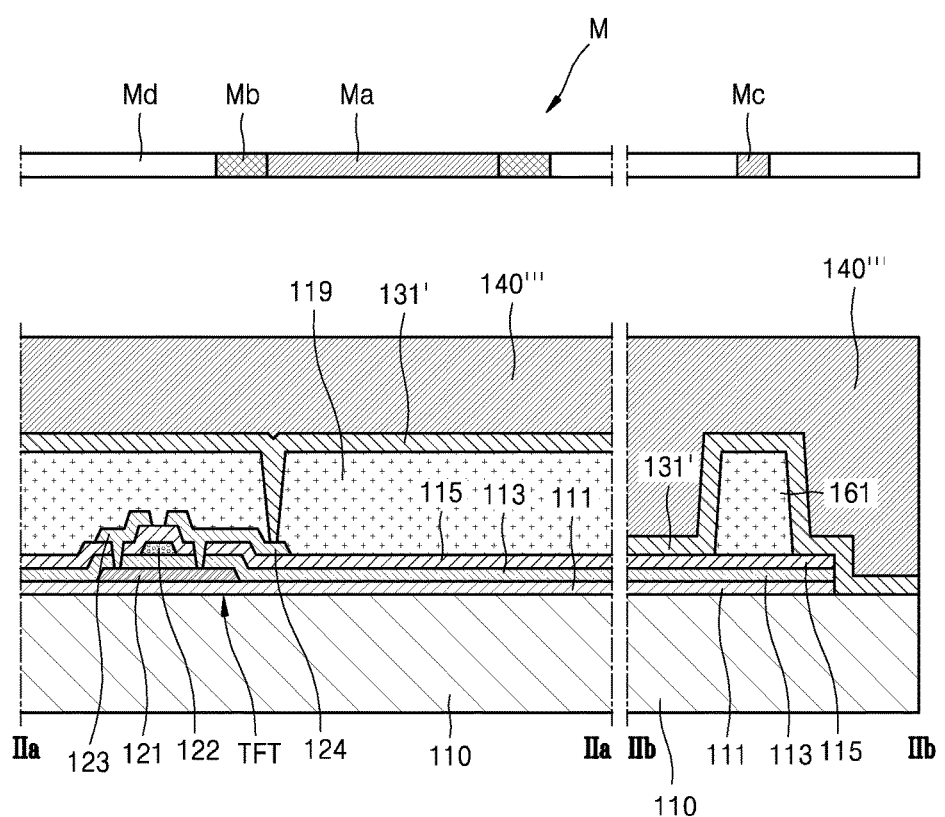

Referring to FIG. 4C, a conductive material 131' and a second insulation material 140''' may be formed on the via insulation film 119 and the first insulation film 161. The conductive material 131' may include at least one transparent conductive oxide selected from a group consisting of indium tin oxide (ITO), indium zinc oxide (IZO), zinc oxide (ZnO), indium oxide (In$_2$O$_3$), indium gallium oxide (IGO) and aluminum zinc oxide (AZO). In addition to the transparent conductive oxide, the conductive material 131' may further include a metal reflective film including silver (Ag), magnesium (Mg), aluminum (Al), platinum (Pt), lead (Pd), gold (Au), nickel (Ni), Neodymium (Nd), iridium (Ir), and chrome (Cr). The second insulation material 140''' may include a photosensitive organic compound such as polyimide.

Light is irradiated to the second insulation material 140''' by using a half tone mask M. The half tone mask M may include a light transmitting portion Md, a light shielding portion Mb and Mc, and a semi light transmitting portion Ma. The light transmitting portion Md may correspond to an area where the conductive material 131 is completely removed, the light shielding portion Mb and Mc may correspond to an area where the second insulation material 140''' remains, and the semi light transmitting portion Ma may correspond to an area where a portion of the second insulation material 140''' remains and then removed by the ashing process.

Figure 4D:
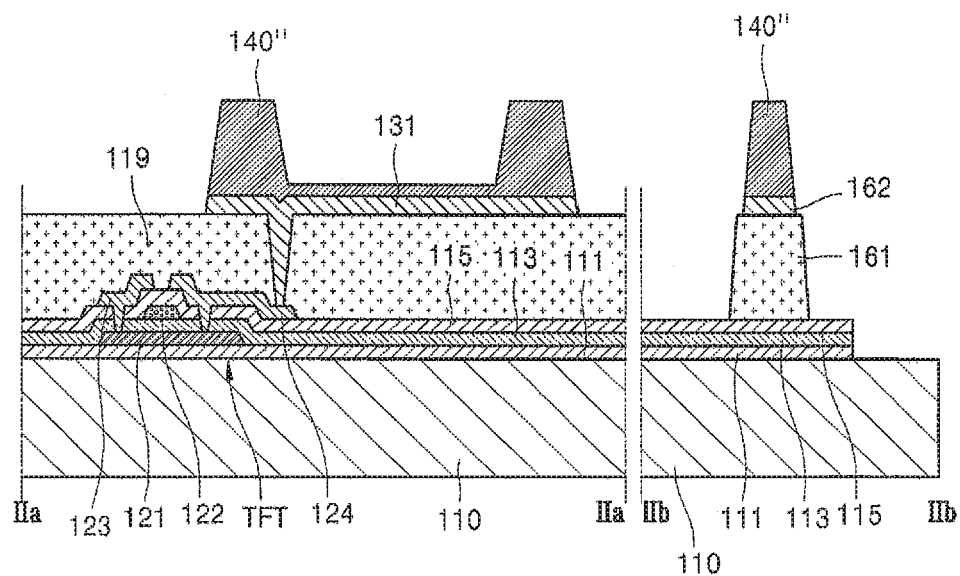

Referring to FIG. 4D, the light passing through light transmitting portion Md is irradiated to completely remove the second insulation material 140''', and the light passing through the semi light transmitting portion Ma is irradiated to remove a portion of the second insulation material 140'''. The conductive material 131, which is exposed by completely removing the second insulation material 140''', may be etched to form the pixel electrode 131 and the floating conductor 162.

Through the above-described process, a patterned second insulation material 140''' may remain on the pixel electrode 131, the floating conductor 162, and the pixel electrode 131 and the floating conductor 162.

Figure 4E:
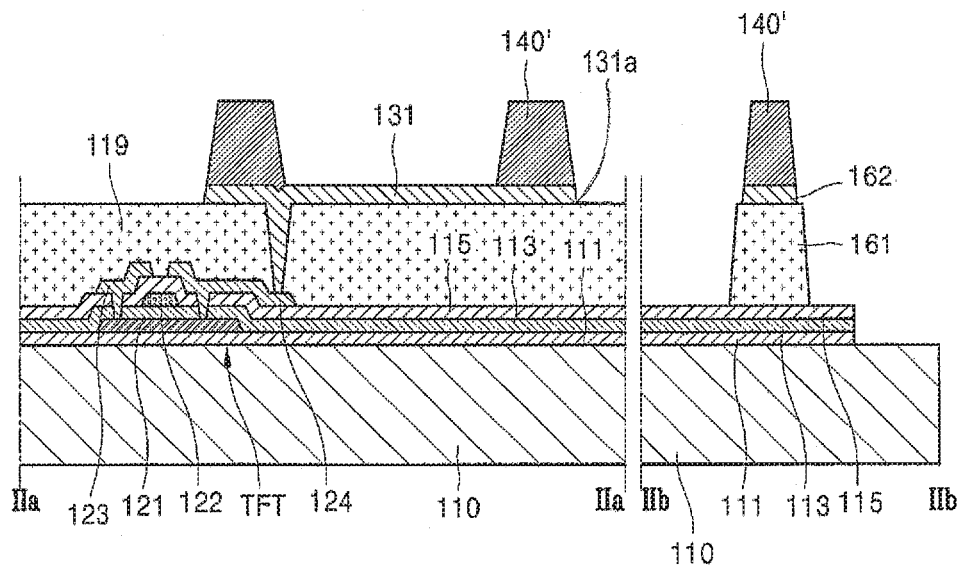

Referring to FIG. 4E, a portion of the second insulation material 140''' which is patterned through the ashing process may be removed. In embodiments, a height of the patterned second insulation material 140''' may be lowered according to the ashing process. A portion of the second insulation material 140''', which remains due to the light irradiated through the semi light transmitting portion Ma of FIG. 4C, is completely removed such that a center area of the pixel electrode 131 is exposed. FIG. 4E illustrates a second insulation material 140' after the ashing process. The end 131a of the pixel electrode 131 may not be covered by the second insulation material 140'.

Figure 4F:
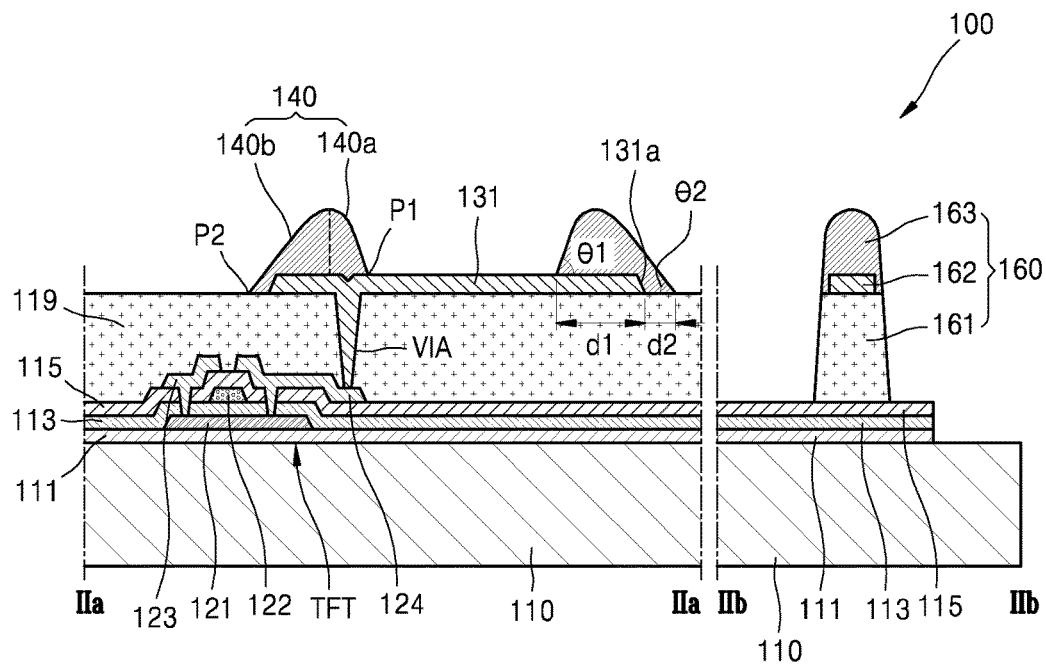

Referring to FIG. 4F, by applying heat to the second insulation material 140' after the ashing process, the second insulation material 140' reflows to form the pixel defining layer 140 to cover the edge area of the pixel electrode 131. The second insulation material 140' may slip down by the thermal reflowing and cover the end 131a of the pixel electrode 131. When the end 131a of the pixel electrode 131 is exposed to the outside, the pixel electrode 131 may have a short circuit with the opposite electrode 133 of FIG. 4G, which is formed by a following process. In order to prevent or avoid the short circuit, the reflow process is performed such that the pixel defining layer 140 covers the end 131a of the pixel electrode 131.

The second insulation material 140', which remains on the floating conductor 162 of the peripheral area PA of FIG. 1 after the ashing process, may slip down by the reflowing process to form the second insulation film 163 to completely cover the floating conductor 162. The first insulation film 161, the floating conductor 162, and the second insulation film 163 may form the dam portion 160.

According to one embodiment, a manufacturing method of the organic light-emitting display apparatus 100 may include forming the pixel electrode 131 and the pixel defining layer 140 by using a single mask, for example, the half tone mask M. Accordingly, manufacturing costs may be reduced and a manufacturing process may be simplified.

In embodiments, the dam portion 160' of FIG. 3, which is a modified embodiment, may be formed by adjusting a width of the light shielding portion Mc of the half tone mask M of FIG. 4C, which corresponds to the peripheral area PA. In embodiments, the width of the light shielding portion Mc when the dam portion 160 of FIG. 2 may be formed greater than the width of the light shielding portion Mc when the dam portion 160' of FIG. 3 is formed. The second insulation film 163 of the dam portion 160' of FIG. 3 may completely cover the first insulation film 161' by slipping down to the side surface of the first insulation film 161' during the reflowing process.

Figure 4G:
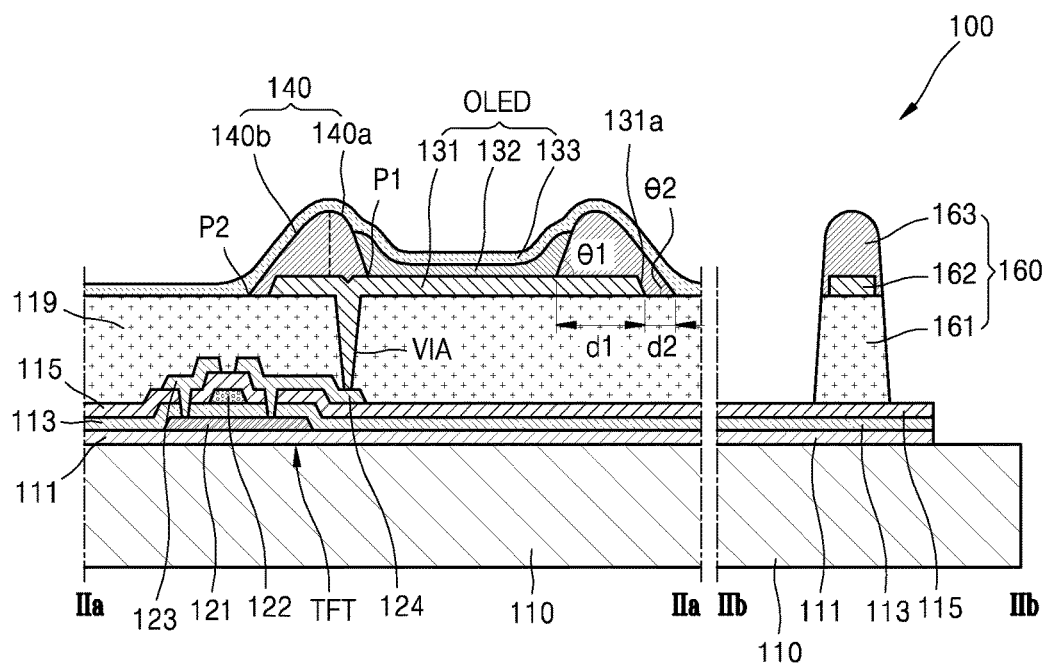

Referring to FIG. 4G, after the organic light-emitting layer 132 is formed on an area of the pixel defining layer 140 in which the pixel defining layer 140 does not cover the pixel electrode 131, the opposite electrode 133 is formed on the organic light-emitting layer 132. The opposite electrode 133 may be disposed in the display area DA and may not be disposed in the peripheral area PA.

Figure 4H:
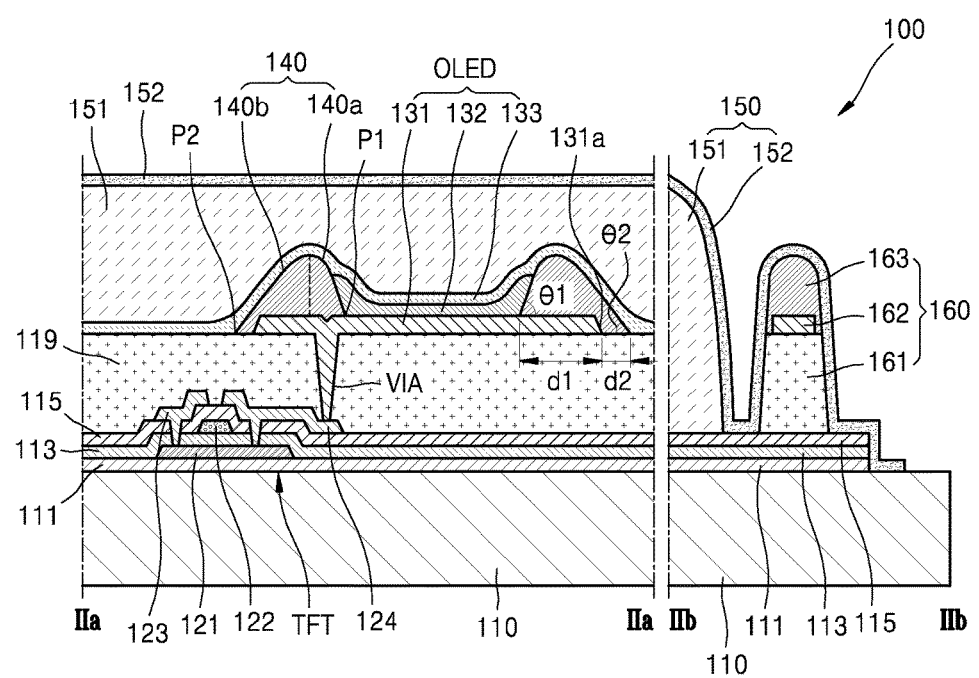

Referring to FIG. 4H, the thin film encapsulation layer 150 includes the at least one inorganic film 152 and the at least one organic film 151 on the opposite electrode 133. The organic film 151 may be disposed inside the dam portion 160, and the inorganic film 152 may be extended from the display area DA to the dam portion 160 and the outermost edge area of the substrate 110. The inorganic film 152 may include an area in which the inorganic film 152 directly contacts the substrate 110.

Figure 5:
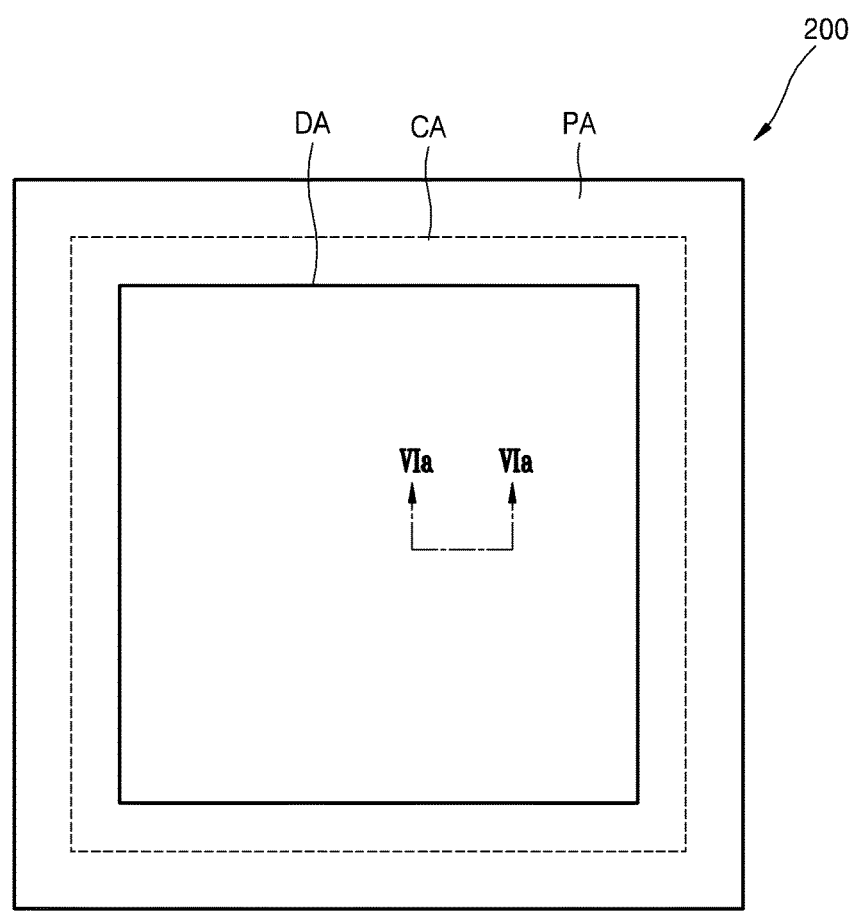
FIG. 5 is a plan view schematically illustrating an organic light-emitting display apparatus according to an embodiment of the present inventive concept.
Figure 6:
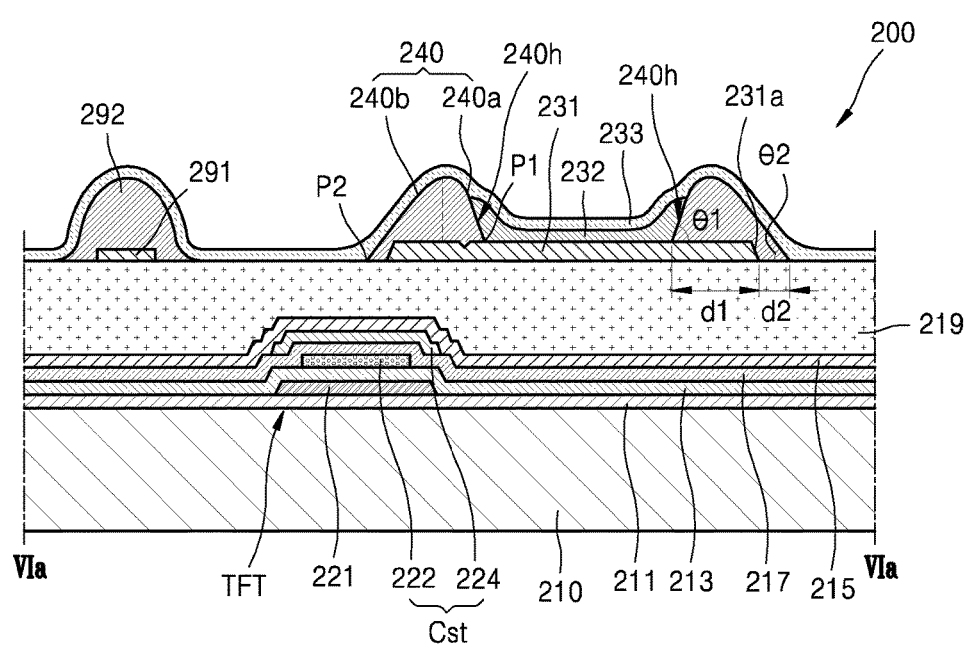
FIG. 6 is a cross-sectional view taken along a line VIa-VIa of FIG. 5.

FIG. 5 is a plan view schematically illustrating an organic light-emitting display apparatus 200 according to an embodiment of the present inventive concept, and FIG. 6 is a cross-sectional view taken along a line VIa-VIa of FIG. 5.

Referring to FIGS. 5 and 6, the organic light-emitting display apparatus 200 may include a substrate 210 which is divided into a center area CA including a display area DA and a peripheral area PA surrounding the center area CA, thin film transistors TFTs disposed in the display area DA, a via insulation film 219 disposed to cover the thin film transistor TFT, a pixel electrode 231 disposed on the via insulation film 219 and electrically connected to the thin film transistor TFT, a pixel defining layer 240 which is disposed to cover an edge area of the pixel electrode 231, includes an opening 240h to expose a center area of the pixel electrode 231, and includes a first inclination portion 240a extended from an area P1 disposed at a contact portion between an upper surface of the pixel electrode 231 and the opening 240h and a second inclination portion 240b extended from the first inclination portion 240a to an area P2 on an upper surface of the via insulation film 219 in an inclination direction different from an inclination direction of the first inclination portion 240a, an opposite electrode 233 facing the pixel electrode 231, and an organic light-emitting layer 232 disposed between the pixel electrode 231 and the opposite electrode 233. An end 231a of the pixel electrode 231 may be disposed between the via insulation film 219 and the second inclination portion 240b.

The substrate 210 may include various materials, for example, glass, metal, or plastic. According to one embodiment, the substrate 210 may be a substrate including a flexible material. Here, the flexible substrate 210 may be flexible, bendable, foldable, and rollable. The flexible substrate 210 may include ultra-thin glass, metal or plastic. When the substrate 210 includes plastic, the substrate 210 may include polyimide (PI), but is not limited thereto.

The substrate 210 may be divided into the peripheral area PA and the center area CA. In detail, the peripheral area PA is adjacent to an edge portion of the substrate 210, and the center area CA is an internal area of the peripheral area PA. The center area CA may include the display area DA.

A plurality of pixels are arranged in the display area DA, the organic light-emitting device OLED may be disposed in each pixel to realize an image. According to one embodiment, a non-display area including a driver and a pad portion may surround the display area DA.

A buffer film 211 may be disposed on the substrate 210 to prevent, minimize or reduce permeation of impurities and to planarize a surface of the substrate 210. The thin film transistor TFT may be disposed on the display area DA of the buffer film 211. A barrier layer may be disposed between the substrate 210 and the buffer film 211. The buffer film 211 may be omitted if necessary.

The thin film transistor TFT may function as a portion of a driving circuit to drive the organic light-emitting device OLED, and the driving circuit may include a capacitor and wiring line in addition to the thin film transistor TFT.

The thin film transistor TFT may include an active layer 221 disposed on the buffer film 211 and a gate electrode 222 disposed on at least a portion of the active layer 221. The active layer 221 may include a channel area including a semiconductor and also include a source area and a drain area disposed opposite to each other with respect to the channel area. A data signal is applied to the source area, and the drain area is directly connected to the pixel electrode 231 or indirectly electrically connected to the pixel electrode 231 through a component, such as another thin film transistor TFT.

An upper electrode 224 of a capacitor Cst may be disposed on the gate electrode 222. The gate electrode 222 may function as a lower electrode of the capacitor Cst with the gate electrode 22 of the thin film transistor TFT.

In embodiments, the thin film transistor TFT and the capacitor Cst may be disposed to overlap each other to lengthen the channel area of the active layer 221 and significantly increase a capacitance of the capacitor Cst and thus decrease an area occupied by a driving circuit including the thin film transistor TFT and the capacitor Cst. Through this structure, a high resolution of the organic light-emitting display apparatus 200 may be realized.

A gate insulation film 213 may be disposed between the active layer 221 and the gate electrode 222, a dielectric film 217 may be disposed between the gate electrode 222 and the upper electrode 224, and an interlayer insulation layer 215 may be disposed on the upper electrode 224.

The gate insulation film 213, the dielectric film 217, and the interlayer insulation film 215 may include a single film and a multi film including an inorganic compound, for example, silicon dioxide ($SiO_2$), silicon nitride (SiNx), silicon nitride oxide (SiON), aluminum oxide ($Al_2O_3$), titanium oxide ($TiO_2$), tantalum oxide ($Ta_2O_5$), hafnium oxide ($HfO_2$), and/or zirconium oxide ($ZrO_2$).

The via insulation film 219 may be disposed to cover the thin film transistor TFT, may eliminate steps formed by the thin film transistor TFT, and may planarize an upper surface of the thin film transistor TFT. The via insulation film 219 may include a single film and a multi film including an organic compound. However, the present inventive concept is not limited thereto. According to other embodiment, the via insulation film 219 may be a composite laminate including an inorganic insulation film and an organic insulation film.

The pixel electrode 231 may be disposed on the via insulation film 219, and a wiring line 291 may be disposed on the via insulation film 219 and may include the same material in the same layer as the pixel electrode 231. The wiring line 291 may be spaced apart from the pixel electrode 231, and a kind of the wiring line may not be limited to a certain wiring line but may be a data wiring line or an initialized voltage wiring line or may function as an auxiliary wiring line electrically connected to a wiring line disposed on another layer.

The pixel defining layer 240 may cover an edge area of the pixel electrode 231, include an opening 240h through which a center area of the pixel electrode 231 is exposed, and further include a first inclination portion 240a, which is extended from an area P1 where an upper surface of the pixel electrode 131 and the opening 240h contact, and a second inclination portion 240b, which is extended from the first inclination portion 240a to an area P2, which is disposed at an upper surface of the via insulation film 219, in a direction different from an inclination direction of the first inclination portion 240a.

The first inclination portion 240a may be extended from an area in which the upper surface of the pixel electrode 231 and the opening 240h contact, in a direction away from the substrate 210. The second inclination portion 240b may be extended from the first inclination portion 240a in a direction toward the substrate 210. Here, the direction away from the substrate 210 and the direction toward the substrate 210 may not be a direction perpendicular to the substrate 210 but a direction inclined by a certain degree with respect to a major plane of the substrate 210.

The pixel defining layer 240 may be a photosensitive organic compound which may include polyimide (PI), for example.

The pixel electrode 231 may be disposed in most areas between the pixel defining layer 240 and the via insulation film 219. An area where the pixel defining layer 240 and the via insulation 219 contact may be a small area, compared to an area where the pixel electrode 231 is disposed. In embodiments, the area P2 of the upper surface of the via insulation film 219 may be adjacent to an end 231*a* of the pixel electrode 231.

The edge area of the pixel electrode 231 is between the via insulation film 219 and the first inclination portion 240*a* of the pixel defining layer 240 and also extended to be between the via insulation film 219 and the at least a portion of the second inclination portion 240*b* of the pixel definition portion 240. In embodiments, an edge 231*a* of the pixel electrode 231 may be disposed between the via insulation film 219 and the second inclination portion 240*b*. A distance d1 from the area P1 of the upper surface of the pixel electrode 231 to the end 231*a* of the pixel electrode 231, which is covered by the pixel defining layer 240, may be greater than a distance d2 from the area P2 of the upper surface of the via insulation film 219 to the end 231*a* of the pixel electrode 231.

According to one embodiment, a first angle θ1 formed between the pixel electrode 231 and the first inclination portion 240*a* may be greater than a second angle θ2 formed between the via insulation film 219 and the second inclination portion 240*b*. The first angle θ1 may be smaller than about 55 degrees, and the second angle θ2 may be smaller than about 40 degrees. A difference between the first angle θ1 and the second angle θ2 may be greater than about 5 degrees.

The first inclination portion 240*a* and the second inclination portion 240*b* may have different slopes according to an area of the pixel defining layer 240. In the different slopes, the first angle θ1 and the second angle θ2 represent angles of the pixel defining layer 240 at the area P1 of the upper surface of the pixel electrode 231 and the area P2 of the upper surface of the via insulation film 219, respectively.

A third insulation film 292 may be disposed on the wiring line 291 and may include the same material in the same layer as the pixel defining layer 240. The third insulation film 292 may be spaced apart from the pixel defining layer 240. The third insulation film 292 may be patterned to correspond to the wiring line 291 to completely cover the wiring line 291. The third insulation film 292 may function to protect the wiring line 291.

An organic light-emitting layer 232 may be disposed on an area of the pixel electrode 231 which is not covered by the pixel defining layer 240, and an opposite electrode 233 may be disposed on the organic light-emitting layer 232. The opposite electrode 233 may cover the organic light-emitting layer 232, the pixel defining layer 240, and the third insulation film 292. The opposite electrode 233 may directly contact the via insulation film 219 in an area disposed between the pixel defining layer 240 and the third insulation film 292.

Figure 7:
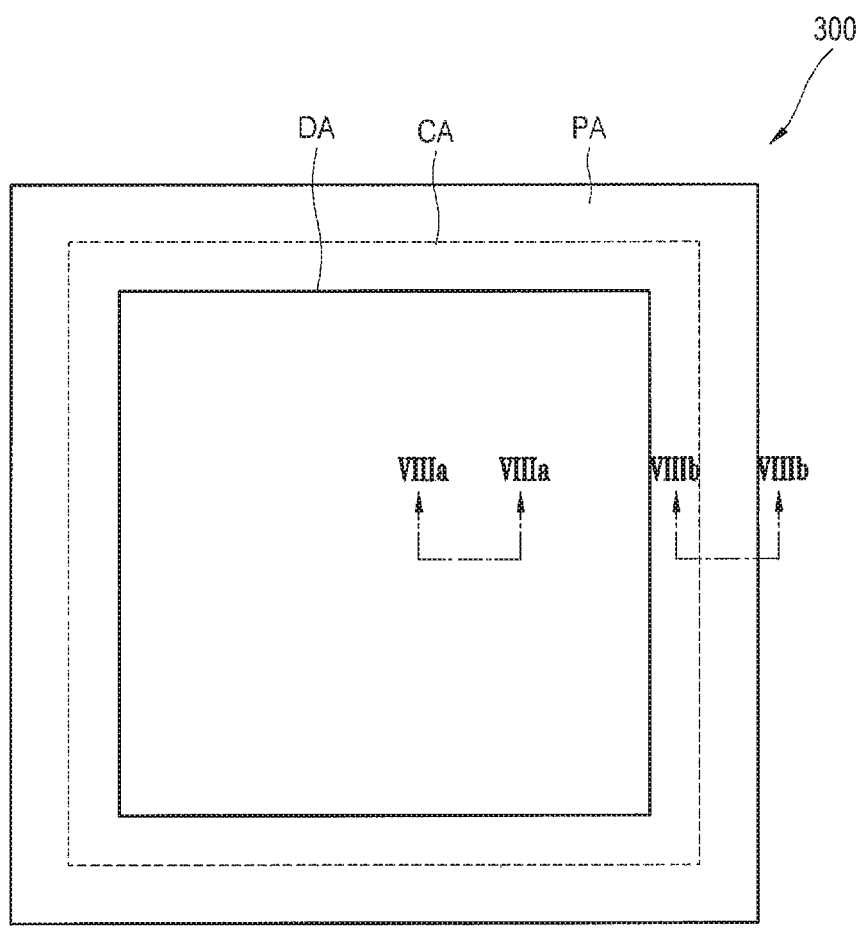
FIG. 7 is a plan view schematically illustrating an organic light-emitting display apparatus according to an embodiment of the present inventive concept.
Figure 8:
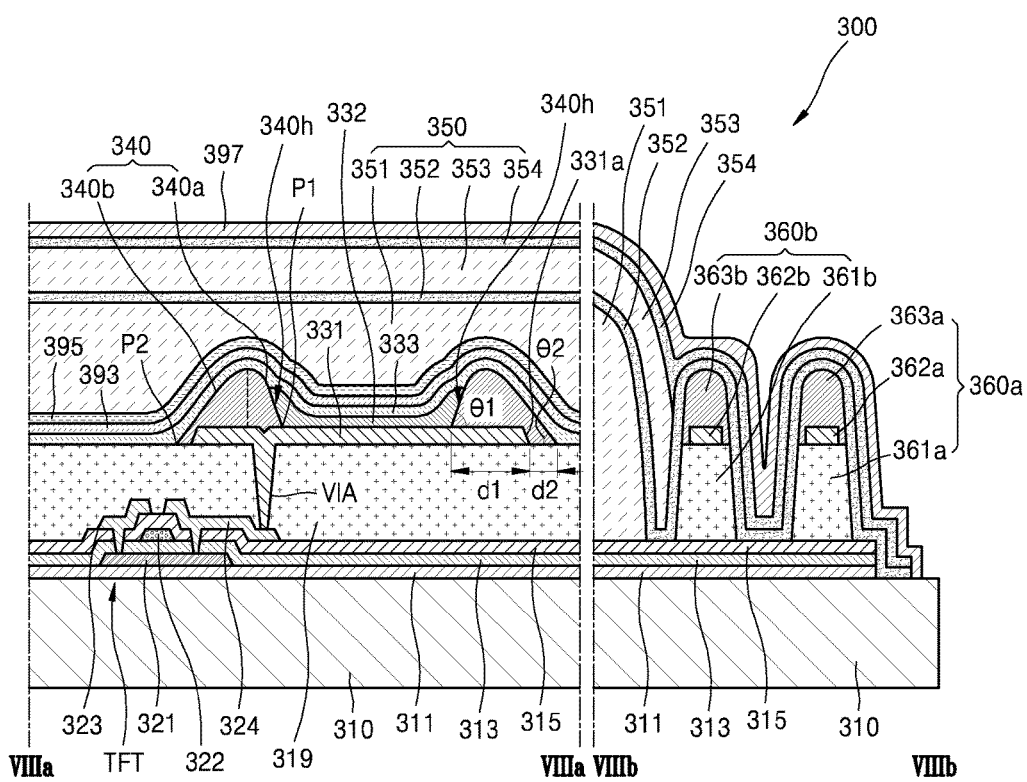
FIG. 8 is a cross-sectional view taken along a line VIIIa-VIIIa and a line VIIIb-VIIIb of FIG. 7.

FIG. 7 is a plan view schematically illustrating an organic light-emitting display apparatus 300 according to an embodiment of the present inventive concept, and FIG. 8 is a cross-sectional view taken along a line VIIIa-VIIIa and a line VIIIb-VIIIb of FIG. 7.

Referring to FIGS. 7 and 8, the organic light-emitting display apparatus 300 may include a substrate 310 which is divided into a center area CA including a display area DA and a peripheral area PA surrounding the center area CA, thin film transistors TFTs disposed in the display area DA of the substrate 310, a via insulation film 319 disposed to cover the thin film transistor TFT, a pixel electrode 331 disposed on the via insulation film 319 and electrically connected to the thin film transistor TFT, a pixel defining layer 340 disposed to cover an edge area of the pixel electrode 331, an opposite electrode 333 facing the pixel electrode 331, and an organic light-emitting layer 332 disposed between the pixel electrode 331 and the opposite electrode 333.

The pixel define layer 340 may include an opening 340*h* to expose a center area of the pixel electrode 331, and also include a first inclination portion 340*a* extended from an area P1 disposed at a contact portion between an upper surface of the pixel electrode 331 and the opening 340*h*, and a second inclination portion 340*b* extended from the first inclination portion 340*a* to an area P2 on an upper surface of the via insulation film 319 in an inclination direction different from an inclination direction of the first inclination portion 340*a*. An end 331*a* of the pixel electrode 331 may be disposed between the via insulation film 319 and the second inclination portion 340*b*.

The substrate 310 may include various materials such as glass, metal, and plastic. According to one embodiment, the substrate 310 may include a substrate including a flexible material. The substrate 310 may be divided into the peripheral area PA and the center area CA. In detail, the peripheral area PA is adjacent to an edge of the substrate 110, and the center area CA is disposed in an inside of the peripheral area PA. The center area CA may include the display area DA.

A plurality of pixels are arranged in the display area DA as an array to display an image, and an organic light-emitting device OLED may be disposed in each pixel. According to one embodiment, a non-display area including a driver and a pad portion may surround the display area DA.

A buffer film 311 may be disposed on the substrate 310 to prevent, minimize or reduce permeation of impurities and to planarize a side of the substrate 310. The thin film transistor TFT may be disposed on the display area DA of the buffer film 311. A barrier layer may be disposed between the substrate 310 and the buffer film 311. The buffer film 311 may be omitted if necessary.

The thin film transistor TFT may function as a portion of a driving circuit to drive the organic light-emitting device OLED, and the driving circuit may include a capacitor and wiring line in addition to the thin film transistor TFT.

The thin film transistor TFT may include an active layer 321 disposed on the buffer film 311, a gate electrode 322 disposed on at least a portion of the active layer 321, a source electrode 323 receiving a data signal, and a drain electrode 324 electrically connected to the pixel electrode 331. A gate insulation film 313 may be disposed between the active layer 321 and the gate electrode 322, and an interlayer insulation film 315 may be disposed between the gate electrode 322 and the source electrode 323 and between the gate electrode 322 and the drain electrode 324. The buffer film 311, the gate insulation film 313, and the interlayer insulation film 315 may be disposed in the display area DA and may be extended from the display area DA to a portion of the peripheral area PA.

The via insulation film 319 covers the thin film transistor TFT, may eliminate steps formed by the thin film transistor TFT, and may planarize an upper surface of the thin film transistor TFT. The via insulation film 319 may be a single film and a multi film including an organic compound. However, the present inventive concept is not limited thereto. According to other embodiment, the via insulation film 319 may be a composite laminate including an inorganic insulation film and an organic insulation film. The pixel electrode 331 may be disposed on the via insulation film 319 to be electrically connected to the thin film transistor TFT through a via hole VIA of the via insulation film 319.

The pixel defining layer 340 may cover an edge area of the pixel electrode 331, include the opening 340h through which a center area of the pixel electrode 331 is exposed, and further include the first inclination portion 340a, which is extended from the area P1 where the upper surface of the pixel electrode 331 and the opening 340h contact, and the second inclination portion 340b, which is extended from the first inclination portion 340a to the area P2, which is disposed at the upper surface of the via insulation film 319, in a direction different from an inclination direction of the first inclination portion 340a.

The first inclination portion 340a may be extended from an area in which the upper surface of the pixel electrode 331 and the opening 340h contact, in a direction away from the substrate 310. The second inclination portion 340b may be extended from the first inclination portion 340a in the direction toward the substrate 310. Here, the direction away from the substrate 310 and the direction toward the substrate 310 may not be a direction perpendicular to the substrate 310 but a direction inclined by a certain degree with respect to a major plane of the substrate 310.

The pixel defining layer 340 may be a photosensitive organic compound which may include polyimide (PI), for example.

The pixel electrode 331 may be disposed in most areas between the pixel define layer 340 and the via insulation film 319. An area where the pixel define layer 340 and the via insulation 319 contact may be a small area, compared to an area where the pixel electrode 331 is disposed. In embodiments, the area P2 of the upper surface of the via insulation film 319 may be adjacent to an end 331a of the pixel electrode 331.

The edge area of the pixel electrode 331 is between the via insulation film 319 and the first inclination portion 340a of the pixel define layer 140 and also extended to be between the via insulation film 319 and the at least a portion of the second inclination portion 340b of the pixel definition portion 340. In embodiments, the end 331a of the pixel electrode 331 may be disposed between the via insulation film 319 and the second inclination portion 340b. A distance d1 from the area P1 of the upper surface of the pixel electrode 331 to the end 331a of the pixel electrode 331, which is covered by the pixel define layer 340, may be greater than a distance d2 from the area P2 of the upper surface of the via insulation film 319 to the end 331a of the pixel electrode 331.

According to one embodiment, a first angle θ1 formed between the pixel electrode 331 and the first inclination portion 340a may be greater than a second angle θ2 formed between the via insulation film 319 and the second inclination portion 340b. The first angle θ1 may be smaller than 55 degrees, and the second angle θ2 may be smaller than 40 degrees. A difference between the first angle θ1 and the second angle θ2 may be greater than 5 degrees.

The organic light-emitting layer 332 may be disposed on an area of the pixel electrode 331 which is not covered by the pixel define layer 340, and the opposite electrode 333 may be disposed on the organic light-emitting layer 332. The opposite electrode 333 may be disposed on the organic light-emitting layer 332 and the pixel define layer 340 and may include an area in which the opposite electrode 333 directly contact the via insulation film 319. The opposite electrode 333 may be disposed in the display area DA and may not be disposed in the peripheral area PA.

According to one embodiment, an encapsulation layer 350 may be disposed on the opposite electrode 333 and seal the organic light-emitting device OLED. The encapsulation layer 350 may include one or more organic films 351 and 353 and one or more inorganic films 352 and 354. The encapsulation layer 350 may seal the organic light-emitting device OLED to prevent or inhibit the organic light-emitting device OLED from being exposed to air or foreign materials. Since the encapsulation layer 350 may have a very small thickness, the encapsulation layer 350 may be usable as an encapsulation unit of a flexible display apparatus, which is bendable or foldable. The organic films 351 and 353 and the inorganic films 352 and 354 may be alternately arranged.

A functional layer 393 and a first protection layer 395 may be disposed between the opposite electrode 333 and the organic film 351. The functional layer 393 may include a capping layer and/or a LiF layer, control a refractive index of visible light emitted from the organic light-emitting device OLED, and improve a light efficiency of the organic light-emitting device OLED. The protection layer may include an inorganic compound such as aluminum oxide. The functional layer 393 and the first protection layer 395 may be disposed in the display area DA like as the opposite electrode 333 and may not be disposed in the peripheral area PA.

Dam portions 360a and 360b may be disposed in the peripheral area PA of the substrate 310. The dam portions 360a and 360b include a plural dam portion and may include first insulation films 361a and 361b, second insulation films 363a and 363b, and floating conductors 362a and 362b disposed between the first insulation films 361a and 361b and between the second insulation films 363a and 363b, respectively. The first insulation films 361a and 361b, the floating conductors 362a and 362b, and the second insulation films 363a and 363b may include the same materials in the same layers as the via insulation film 319, the pixel electrode 331, and the pixel defining layer 340 which are disposed in the display area DA, respectively. The floating conductors 362a and 362b may be disposed on the first insulation films 361a and 361b and may be completely covered by the second insulation films 363a and 363b, respectively. In embodiments, the floating conductors 362a and 362b may be disposed on portions of upper surfaces of the first insulation films 361a and 361b, and the second insulation films 363a and 363b are disposed to cover the floating conductors 362a and 362b which are disposed on the first insulation films 361a and 361b, respectively. Other portions of the first insulation films 361a and 361b, on which the floating conductors 362a and 362b are not disposed, may directly contact the second insulation films 363a and 363b, respectively.

The dam portions 360a and 360b are disposed in the peripheral area PA, may be disposed on the interlayer insulation film 315, and may be disposed closer to the edge of the substrate 310 than the organic films 351 and 353 are. In embodiments, the dam portions 360a and 360b may reduce or prevent an overflow of a material of the organic films 351 and 353 in a direction toward the edge of the substrate 310 when the organic films 351 and 353 of the thin film encapsulation layer 350 are formed. In embodiments, the organic films 351 and 353 of the thin film encapsulation layer 350 may be disposed inside the dam portions 360a and 360b. In embodiments, the dam portion 360b surrounds the plurality of pixels when viewed in the viewing direction and the dam portion 360a surrounds the dam portion 360b. A trench or moat is provided between the two dam portions 360a and 360b.

According to one embodiment, the organic light-emitting display apparatus 300 of FIG. 8 may include two dam portions 360a and 360b which may provide double prevention structures minimizing or avoiding of the overflow of the material of the organic films 351 and 353. FIG. 8 illustrates two dam portions including three layers of the first insulation films 361a and 361b, the floating conductors 362a and 362b, and the second insulation films 363a and 363b, respectively. However, the present inventive concept is not limited thereto, One of the two dam portions 360a and 360b may include a single layer or a multilayer.

The inorganic films 352 and 354 of the thin film encapsulation layer 350 may be extended from the display area DA to upper surfaces of the dam portions 360a and 360b, and at least one of the inorganic films 352 and 354 may completely cover the dam portions 360a and 360b. The inorganic films 352 and 354 of the thin film encapsulation layer 350 may be further extended to an edge area of the substrate 310 from the dam portions 360a and 360b. The inorganic films 352 and 354 of the thin film encapsulation layer 350 may also be extended to an area of an upper surface of the interlayer insulation film 315 and directly .contact an upper surface of the substrate 310. At least one of the inorganic films 352 and 354 may include areas to directly contact the interlayer insulation film 315 in both opposite directions from the dam portions 360a and 360b.

A second protection layer 397 may be disposed on the thin film encapsulation layer 350 and may include an inorganic compound such as aluminum oxide. The second protection layer 397 may be extended from the display area DA to the peripheral area PA like as the inorganic films 352 and 354, may completely cover upper surfaces of the dam portions 360a and 360b, and may be extended to the exposed edge portion of the substrate 310. In embodiments, the second protection layer 397 may include an area to directly contact the substrate 310.

Figure 9:
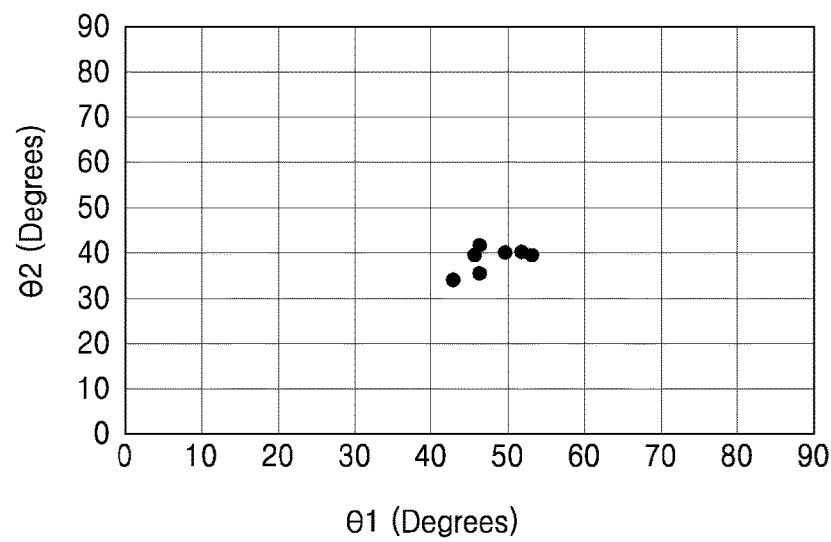
FIG. 9 is a graph illustrating a first angle θ1 of a first inclination portion and a second angle θ2 of a second inclination portion of the organic light-emitting display apparatus of FIG. 2.
Figure 10:
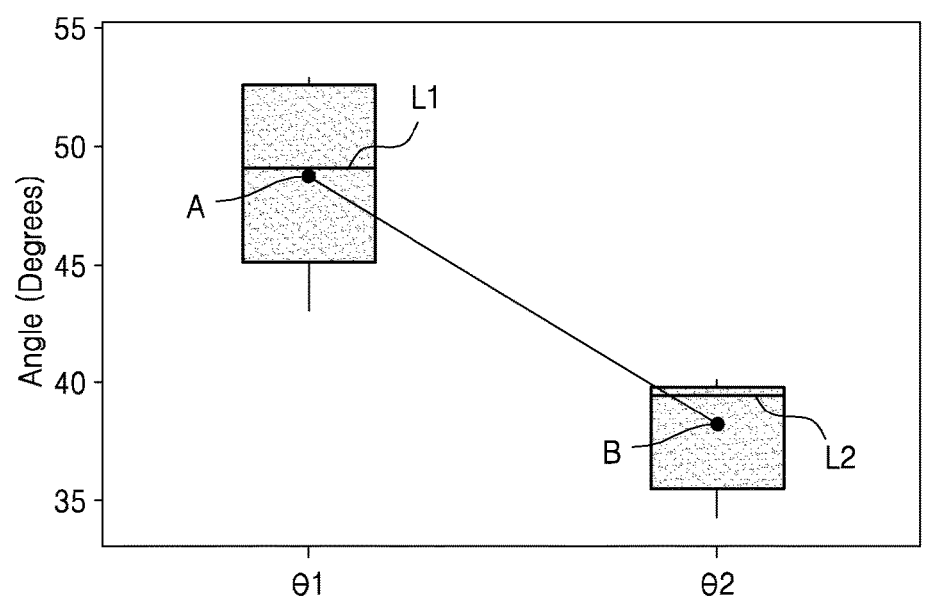
FIG. 10 is a graph illustrating variations and average values of the first angle θ1 and the second angle θ2 of FIG. 9.

FIG. 9 is a graph illustrating the first angle θ1 of the first inclination portion 140a and the second angle θ2 of the second inclination portion 140b of the organic light-emitting display apparatus 100 of FIG. 2, and FIG. 10 is a graph illustrating variations and average values of the first angle θ1 and the second angle θ2 of FIG. 9.

The first angle θ1 of the first inclination portion 140a and the second angle θ2 of the second inclination portion 140b of the pixel defining layer 140 included in the organic light-emitting display apparatus 100 of FIG. 2 may have distribution as illustrated in FIG. 9.

The first angle θ1 may be smaller than about 55 degrees, and the second angle θ2 may be smaller than about 40 degrees. The first angle θ1 may be greater than the second angle θ2 since an reflow amount of the pixel defining layer 140 disposed on the pixel electrode 131 is different from an reflow amount of the pixel defining layer 140 disposed on the via insulation film 119.

According to one embodiment, a difference between the first angle θ1 and the second angle θ2 is greater than about 5 degrees.

In the graph of FIGS. 10, L1 and L2 represent median values of data of the first angle θ1 and the second angle θ2 having certain distributions, A and B represent average values of the data of the first angle θ1 and the second angle θ2.

As stated above, according to one embodiment of the present inventive concept, the organic light-emitting display apparatuses 100, 200, and 300 and the manufacturing methods of the same may reduce the number of masks, reduce the manufacturing costs, and simplify the manufacturing process.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. An organic light-emitting display apparatus comprising:
   a substrate comprising a surface which comprises a display area and a peripheral area that is around the display area;
   a thin film transistor disposed over the display area of the substrate;
   an insulation film disposed over the thin film transistor;
   a pixel electrode disposed over the insulation film and electrically connected to the thin film transistor;
   a pixel defining layer disposed over the pixel electrode, and comprising an opening to expose a center area of the pixel electrode, the pixel defining layer comprising an inner edge, an outer edge, a convex portion between the inner edge and the outer edge, a first inclination portion extended from the inner edge toward the convex portion and a second inclination portion extended from the outer edge toward the convex portion;
   an opposite electrode facing the pixel electrode;
   an organic light-emitting layer disposed between the pixel electrode and the opposite electrode; and
   at least one dam portion disposed over the peripheral area of the substrate,
   wherein the pixel electrode comprises an end disposed between the insulation film and the second inclination portion, and the second inclination portion overlaps the end of the pixel electrode when viewed in a viewing direction perpendicular to the surface of the substrate,
   wherein a first angle between the pixel electrode and the first inclination portion is greater than a second angle between the insulation film and the second inclination portion, and
   wherein the dam portion comprises:
      a first dam insulation layer comprising the same materials as the insulation film;
      a floating conductor disposed on the first dam insulation layer, the floating conductor comprising the same materials as the pixel electrode; and
      a second dam insulation layer comprising the same materials as the pixel defining layer, the second dam insulation layer covering the top surface and alt side walls of the floating conductor.
2. The organic light-emitting display apparatus of claim 1, wherein the first angle is smaller than about 55 degrees and the second angle is smaller than about 40 degrees.

3. The organic light-emitting display apparatus of claim 1, wherein a difference between the first angle and the second angle is greater than about 5 degrees.

4. The organic light-emitting display apparatus of claim 1, wherein, when viewed in the viewing direction, a distance between the inner edge of the pixel defining film and the end of the pixel electrode is longer than a distance between the outer edge of the pixel defining film and the end of the pixel electrode.

5. The organic light-emitting display apparatus of claim 1, wherein the floating conductor is disposed on the first dam insulation layer and completely covered by the second dam insulation layer when viewed in the viewing direction.

6. The organic light-emitting display apparatus of claim 1, further comprising
another dam portion, wherein the dam portion is disposed between the other dam portion and the display area when viewed the viewing direction.

7. The organic light-emitting display apparatus of claim 1, further comprising
a thin film encapsulation layer disposed over the opposite electrode and comprising at least one inorganic film and at least one organic film.

8. The organic light-emitting display apparatus of claim 7, further comprising
an array of pixels formed over the display area of the substrate, each pixel comprising the pixel electrode, the organic light-emitting layer and the opposite electrode,
wherein the at least one inorganic film covers the array of pixels formed over the display area of the substrate and the dam portion surrounding the array of pixels.

9. The organic light-emitting display apparatus of claim 1, further comprising:
a wiring line comprising the same material as the pixel electrode, and spaced apart from the pixel electrode; and
a wiring insulation layer disposed to completely cover the wiring line and patterned to correspond to the wiring, wherein the wiring insulation layer comprises the same material as the pixel defining layer and is spaced apart from the pixel defining layer.

10. The organic light-emitting display apparatus of claim 1, further comprising:
a capacitor disposed to overlap the thin film transistor when viewed in the viewing direction,
wherein the thin film transistor comprises an active layer disposed over the substrate and a gate electrode disposed over at least a portion of the active layer and insulated from the active layer, and wherein an upper capacitor electrode is disposed over the gate electrode to form the capacitor together with the gate electrode.

11. The organic light-emitting display apparatus of claim 1, wherein the pixel electrode is connected to the TFT through a via hole, and wherein the first inclination portion overlaps the via hole in the depth dimension of the display apparatus.

12. The organic light-emitting display apparatus of claim 1, wherein the opposite electrode additionally covers and directly contacts all of the organic light-emitting layer, part of the first inclination portion of the pixel defining layer and the insulation film in the display area.

13. An organic light-emitting display apparatus comprising:
a substrate comprising a surface which comprises a display area and a peripheral area that is around the display area;
a thin film transistor disposed over the display area of the substrate;
an insulation film disposed over the thin film transistor;
a pixel electrode disposed over the insulation film and electrically connected to the thin film transistor;
a pixel defining layer disposed over the pixel electrode;
an opposite electrode facing the pixel electrode, wherein the opposite electrode covers and directly contacts the pixel defining layer in the display area;
an organic light-emitting layer disposed between the pixel electrode and the opposite electrode; and
a dam portion disposed over the peripheral area of the substrate, wherein the dam portion comprises:
a first dam insulation layer comprising the same material as the insulation film and spaced apart from the insulation film;
a floating conductor disposed over the first dam insulation layer, comprising the same material as the pixel electrode, and spaced apart from the pixel electrode; and
a second insulation film comprising the same material as the pixel defining layer and spaced apart from the pixel defining layer,
wherein the pixel defining layer comprises an opening to expose a center area of the pixel electrode;
wherein the pixel defining layer comprises an inner edge, an outer edge, a convex portion between the inner edge and the outer edge, a first inclination portion extended from the inner edge toward the convex portion and a second inclination portion extended from the outer edge toward the convex portion;
wherein the pixel electrode comprises an end disposed between the insulation film and the second inclination portion, and the second inclination portion overlaps the end of the pixel electrode when viewed in a viewing direction perpendicular to the surface of the substrate, and
wherein a first angle between the pixel electrode and the first inclination portion is greater than a second angle between the insulation film and the second inclination portion.

14. The organic light-emitting display apparatus of claim 13, wherein the floating conductor is disposed over the first dam insulation layer and is completely covered by the second dam insulation layer.

15. The organic light-emitting display apparatus of claim 13, further comprising:
a thin film encapsulation layer disposed over the opposite electrode and including at least one inorganic film and at least one organic film.

16. The organic light-emitting display apparatus of claim 15, wherein the at least one inorganic film covers the display area and the dam portion.

17. The organic light-emitting display apparatus of claim 16, wherein the at least one inorganic film directly contacts the surface of the substrate.

18. The organic light-emitting display apparatus of claim 13, wherein, when viewed in the viewing direction, a distance from the inner edge of the pixel defining film and the end of the pixel electrode is longer than a distance between the outer edge of the pixel defining film and the end of the pixel electrode.

19. The organic light-emitting display apparatus of claim 13, wherein the pixel defining layer comprises a photosensitive organic material.

20. The organic light-emitting display apparatus of claim 13, further comprising another dam portion, wherein the dam portion is disposed between the other dam portion and the display area when viewed a viewing direction perpendicular to the surface of the substrate.

21. A manufacturing method of an organic light-emitting display apparatus, the method comprising:
providing a substrate comprising a surface which comprises a display area and a peripheral area that is around the display area;
forming a thin film transistor over the display area of the substrate;
forming a first insulation material over the thin film transistor;
patterning the first insulation material to form an insulation film disposed over the display area and a first dam insulation layer disposed over the peripheral area and spaced apart from the insulation film;
forming a conductive material over the insulation film and the first dam insulation layer;
forming a second insulation material over the conductive material;
irradiating light to the second insulation material and removing at least a portion of the second insulation material to expose the conductive material;
etching an exposed area of the conductive material to form a pixel electrode and a floating conductor spaced apart from the pixel electrode;
reflowing the second insulation material to form a pixel defining layer over the pixel electrode and a second dam insulation layer over the floating conductor, wherein the pixel defining layer comprises an opening that exposes a center area of the pixel electrode, an inner edge, an outer edge, a convex portion between the inner edge and the outer edge, a first inclination portion that extends from the inner edge toward the convex portion and a second inclination portion that extends from the outer edge toward the convex portion, wherein a first angle between the pixel electrode and the first inclination portion is greater than a second angle between the insulation film and the second inclination portion;
forming an organic light-emitting layer over the pixel electrode; and
forming an opposite electrode over the organic light-emitting layer.

22. The manufacturing method of claim 21, wherein the irradiating light to the second insulation material comprises:
irradiating the light to the second insulation material using a half tone mask having a light transmitting portion, a semi light transmitting portion, and a light shielding portion.

23. The manufacturing method of claim 21, further comprising:
etching the exposed area of the conductive material to form a wiring line,
wherein when forming the wiring line, the pixel electrode and the floating conductor are simultaneously formed.

24. The manufacturing method of claim 21, further comprising
forming a thin film encapsulation layer comprising at least one inorganic film and at least one organic film after forming the opposite electrode.

* * * * *